United States Patent
Hong et al.

(10) Patent No.: US 11,805,691 B2
(45) Date of Patent: Oct. 31, 2023

(54) VIEWING ANGLE SWITCHABLE EMISSION SIGNAL GENERATING PART AND VIEWING ANGLE SWITCHABLE DISPLAY DEVICE INCLUDING THE SAME

(71) Applicant: LG DISPLAY CO., LTD., Seoul (KR)

(72) Inventors: Soon-Hwan Hong, Paju-si (KR); Chang-Soo Kim, Paju-si (KR); Seong-Yeong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/976,810

(22) Filed: Oct. 30, 2022

(65) Prior Publication Data
US 2023/0217763 A1 Jul. 6, 2023

(30) Foreign Application Priority Data
Dec. 30, 2021 (KR) .......................... 10-2021-0192431

(51) Int. Cl.
*H10K 59/35* (2023.01)
*G09G 3/3258* (2016.01)
(Continued)

(52) U.S. Cl.
CPC .......... *H10K 59/35* (2023.02); *G09G 3/3258* (2013.01); *H01L 27/1214* (2013.01); *H10K 59/1213* (2023.02); *H10K 59/131* (2023.02); *G09G 2300/0452* (2013.01); *H10K 50/858* (2023.02); *H10K 59/40* (2023.02)

(58) Field of Classification Search
CPC .. H10K 59/35; H10K 59/1213; H10K 59/131; H10K 50/858; H10K 59/40; G09G 3/3258; G09G 2300/0452; H01L 27/1214
See application file for complete search history.

(56) References Cited

U.S. PATENT DOCUMENTS 11,132,953 B2 * 9/2021 Yamada ............... H10K 59/131
11,436,980 B2 * 9/2022 Yamada ............... H10K 59/124
(Continued)

FOREIGN PATENT DOCUMENTS

KR  10-2020-0068822  6/2020

OTHER PUBLICATIONS

European Search Report dated May 15, 2023 issued in Patent Application No. 22209280.1 (20 pages).

*Primary Examiner* — Vinh T Lam
(74) *Attorney, Agent, or Firm* — POLSINELLI PC

(57) ABSTRACT

A display device with a switchable viewing angle includes a timing controller to generate an image data, a data control signal, and a gate control signal, a data driver to generate a data signal using the image data and the data control signal, a gate driver to generate a gate signal and first to third emission signals using the gate control signal, and a display panel including a plurality of subpixels to display an image using the data signal, the gate signal, and the first to third emission signals. The gate driver includes a gate signal generator to generate the gate signal, first emission signal generator to generate the first emission signal, and second and third emission signal generators to generate the second and third emission signals, respectively, using input and output signals of the gate signal generator and input and output signals of the first emission signal generator.

20 Claims, 9 Drawing Sheets

(51) Int. Cl.
  *H01L 27/12* (2006.01)
  *H10K 59/131* (2023.01)
  *H10K 59/121* (2023.01)
  *H10K 50/858* (2023.01)
  *H10K 59/40* (2023.01)

(56) References Cited

U.S. PATENT DOCUMENTS

| | | |
|---|---|---|
| 2015/0048333 A1 | 2/2015 | Choi et al. |
| 2017/0154603 A1* | 6/2017 | Gu .................. G09G 3/3233 |
| 2017/0200412 A1* | 7/2017 | Gu .................. G09G 3/3266 |
| 2021/0028261 A1* | 1/2021 | Lee .................. H10K 59/121 |
| 2021/0181561 A1 | 6/2021 | Kawashima et al. |
| 2021/0191552 A1 | 6/2021 | Bok et al. |
| 2022/0320196 A1* | 10/2022 | He .................. G09G 3/3233 |
| 2022/0399529 A1* | 12/2022 | Shin .................. H10K 50/858 |

* cited by examiner

VIEWING ANGLE SWITCHABLE EMISSION SIGNAL GENERATING PART AND VIEWING ANGLE SWITCHABLE DISPLAY DEVICE INCLUDING THE SAME

CROSS-REFERENCE TO RELATED APPLICATION

The present application claims the priority of Korean Patent Application No. 10-2021-0192431 filed on Dec. 30, 2021, which is hereby incorporated by reference in its entirety.

BACKGROUND

Field of the Disclosure

The present disclosure relates to a display device, and more particularly, to a viewing angle switchable emission signal generating part generating a viewing angle emission signal using two transistors and a viewing angle switchable display device including the viewing angle switchable emission signal generating part.

Description of the Background

Recently, with the advent of an information-oriented society and as the interest in information displays for processing and displaying a massive amount of information and the demand for portable information media have increased, display technologies have rapidly advanced. Thus, various light and thin flat panel display devices have been developed and offered in the marketplace.

Among the various flat panel display devices, an organic light emitting diode (OLED) display device is an emissive type device and does not include a backlight unit used in a non-emissive type device such as a liquid crystal display (LCD) device. As a result, the OLED display device has advantages related to a viewing angle, a contrast ratio and power consumption compared to other types of display devices.

Specifically, the OLED display device may be used in a dashboard of a vehicle. Related to use of OLEDs in vehicles, a viewing angle switchable OLED display device has been researched and developed so that a driver and a passenger can selectively watch an image.

In a viewing angle switchable OLED display device, a wide viewing angle light emitting diode and a narrow viewing angle light emitting diode of each subpixel are independently driven using a viewing angle switchable emission signal. Since a viewing angle switchable emission signal generating part including a shift register is required for generating the viewing angle switchable emission signal, a non-display area of a display panel is enlarged due to the viewing angle switchable emission signal generating part and a narrow bezel is hardly obtained.

SUMMARY

Accordingly, the present disclosure is directed to a viewing angle switchable emission signal generating part and a viewing angle switchable display device including the same that substantially obviate one or more of the problems due to limitations and disadvantages described above.

An object of the present disclosure is to provide a viewing angle switchable emission signal generating part and a viewing angle switchable display device including the viewing angle switchable emission signal generating part where a non-display area is reduced and a narrow bezel is obtained by generating a viewing angle switchable emission signal using two transistors, input and output signals of a gate signal generating part, and an emission signal generating part.

Another object of the present disclosure is to provide a viewing angle switchable emission signal generating part and a viewing angle switchable display device including the viewing angle switchable emission signal generating part where a size of a gate driving unit is minimized and a narrow bezel is obtained by generating a viewing angle switchable emission signal using first and second wide viewing angle signals and first and second narrow viewing angle signals.

Additional features and aspects will be set forth in the description that follows, and in part will be apparent from the description, or may be learned by practice of the present disclosure provided herein. Other features and aspects of the inventive concepts may be realized and attained by the structure particularly pointed out in the written description, or derivable therefrom, and the claims hereof as well as the appended drawings.

In one aspect, a display device with a switchable viewing angle includes a timing controller configured to generate an image data, a data control signal, and a gate control signal, a data driver configured to generate a data signal using the image data and the data control signal, a gate driver configured to generate a gate signal and first to third emission signals using the gate control signal, and a display panel including a plurality of subpixels, the display panel configured to display an image using the data signal, the gate signal, and the first to third emission signals. The gate driver includes a gate signal generator configured to generate the gate signal, first emission signal generator configured to generate the first emission signal, and second and third emission signal generators configured to generate the second and third emission signals, respectively, using input and output signals of the gate signal generator and input and output signals of the first emission signal generator.

In another aspect, the display panel includes an array layer including a plurality of transistors, a storage capacitor and first and second light emitting diodes in each of the plurality of subpixels, a touch layer over the array layer, a lens layer over the touch layer and including a plurality of half cylindrical lenses corresponding to the first light emitting diode and a plurality of half spherical lenses corresponding to the second light emitting diode, and a polarizing layer over the lens layer and including a linear polarizing layer and a retardation layer.

In another aspect, the plurality of subpixels include red, green and blue subpixels forming one pixel, and wherein a first number of the plurality of half spherical lenses in the green subpixel is greater than a second number of the plurality of half spherical lenses in the red subpixel and the first number of the plurality of half spherical lenses is smaller than a third number of the plurality of half spherical lenses in the blue subpixel.

In another aspect, the plurality of subpixels include red, green and blue subpixels constituting one pixel, and wherein a first anode of the first light emitting diode and a second anode of the second light emitting diode in the red subpixel of adjacent pixels are disposed between a first anode of the first light emitting diode and a second anode of the second light emitting diode in the blue subpixel.

In another aspect, the gate signal includes a gate1 signal and a gate2 signal, wherein the gate signal generator includes a first component for generating the gate1 signal and a second component for generating the gate2 signal. The second emission signal generator includes a first wide view transistor switched according to a first wide view signal and generating the first emission signal as the second emission signal, and a second wide view transistor switched according to a second wide view signal having an opposite polarity to the first wide view signal and generating a high logic voltage of the input signal of the first emission signal generating part as the second emission signal. The third emission signal generator includes a first narrow view transistor switched according to a first narrow view signal and generating the first emission signal as the third emission signal, and a second narrow view transistor switched according to a second narrow view signal having an opposite polarity to the first narrow view signal and generating a high logic voltage of the input signal of the first emission signal generating part as the third emission signal.

In another aspect, each of the plurality of subpixels includes a first transistor connected to a high level voltage, a second transistor switched according to the second emission signal and connected to the first transistor, a third transistor switched according to the gate2 signal and connected to the first transistor, a fourth transistor switched according to the gate2 signal and connected to the first transistor, a fifth transistor switched according to the gate2 signal and connected to the second transistor, a sixth transistor switched according to the gate2 signal and connected to the third transistor, a seventh transistor switched according to the first emission signal and connected to a reference signal, and an eighth transistor switched according to the gate1 signal and connected to the data signal. Each of the plurality of subpixels further includes a storage capacitor connected between the first, fourth and eighth transistors, a first light emitting diode connected between the second transistor and a low level voltage, and a second light emitting diode connected between the third transistor and the low level voltage.

In another aspect, during a first time period, the gate1 signal and the first emission signal have a low logic voltage and the gate2 signal has a high logic voltage, the second and third emission signals have a low logic voltage for the first and second light emitting diodes of an ON state, and the second and third emission signals have a high logic voltage for the first and second light emitting diodes of an OFF state. During a second time period, the gate1 signal and the gate2 signal have a low logic voltage and the first emission signal has a high logic voltage, the second and third emission signals have a high logic voltage for the first and second light emitting diodes of an ON state, and the second and third emission signals have a high logic voltage for the first and second light emitting diodes of an OFF state. During a third time period, the gate1 signal, the gate2 signal and the first emission signal have a high logic voltage, the second and third emission signals have a high logic voltage for the first and second light emitting diodes of an ON state, and the second and third emission signals have a high logic voltage for the first and second light emitting diodes of an OFF state. During a fourth time period, the gate1 signal and the gate2 signal have a high logic voltage and the first emission signal has a low logic voltage, the second and third emission signals has a low logic voltage for the first and second light emitting diodes of an ON state, and the second and third emission signals have a high logic voltage for the first and second light emitting diodes of an OFF state.

In another aspect, the second emission signal generator includes a first wide view transistor switched according to a first wide view signal and generating the first gate signal as the second emission signal, and a second wide view transistor switched according to a second wide view signal having an opposite polarity to the first wide view signal and generating a low logic voltage of the input signal of the first emission signal generating part as the second emission signal. The third emission signal generating part includes a first narrow view transistor switched according to a first narrow view signal and generating the gate signal as the third emission signal, and a second narrow view transistor switched according to according to a second narrow view signal having an opposite polarity to the first narrow view signal and generating a low logic voltage of the input signal of the first emission signal generating part as the third emission signal.

In another aspect, the gate signal includes an (n−1)th gate signal and an nth gate signal. Each of the plurality of subpixels includes a first transistor switched according to the nth gate signal and connected to the data signal, a second transistor connected to the first transistor, a third transistor switched according to the first emission signal and connected to the second transistor, a fourth transistor switched according to the second emission signal and connected to the third transistor, a fifth transistor switched according to the third emission signal and connected to the third transistor, a sixth transistor switched according to the first emission signal and connected to the first transistor, a seventh transistor switched according to the nth gate signal and connected to the second transistor, an eighth transistor switched according to the nth gate signal and connected to the fourth transistor, a ninth transistor switched according to the (n−1)th gate signal and connected to the second transistor, a tenth transistor switched according to the first emission signal and connected to a high level voltage, an eleventh transistor switched according to the nth gate signal and connected to a reference voltage, and a twelfth transistor switched according to the (n−1)th gate signal and connected to the reference voltage. Each of the plurality of subpixels further includes a storage capacitor connected between the second, seventh, ninth and tenth transistors, a first light emitting diode connected between the fourth transistor and a low level voltage, and a second light emitting diode connected between the fifth transistor and the low level voltage.

In another aspect, during a first time period, the (n−1)th gate signal has a low logic voltage and the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state. During a second time period, the (n−1)th gate signal and the first emission signal have a high logic voltage and the nth gate signal has a low logic voltage, the second and third emission signals have a low logic voltage for the first and second light emitting diodes of an ON state, and the second and third emission signals have a low logic voltage for the first and second light emitting diodes of an OFF state. During a third time period, the (n−1)th gate signal, the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state. During a fourth time period, the (n−1)th gate signal and the nth gate signal have a high logic voltage and the first emission signal has a low logic voltage, the second and third emission signals has a low logic voltage for the first and second light emitting diodes of an ON state, and the second and third emission signals have a high logic voltage for the first and second light emitting diodes of an OFF state.

In another aspect, the gate signal includes an (n−1)th gate signal and an nth gate signal. Each of the plurality of subpixels includes a first transistor switched according to the nth gate signal and connected to the data signal, a second transistor connected to the first transistor, a third transistor switched according to the first emission signal and connected to the second transistor, a fourth transistor switched according to the second emission signal and connected to the third transistor, a fifth transistor switched according to the third emission signal and connected to the third transistor, a sixth transistor switched according to the first emission signal and connected to the first transistor, a seventh transistor switched according to the nth gate signal and connected to the second transistor, an eighth transistor switched according to the nth gate signal and connected to the fourth transistor, and a ninth transistor switched according to the (n−1)th gate signal and connected to the second transistor. Each of the plurality of subpixels further includes a storage capacitor connected between the second, sixth, seventh and ninth transistors, a first light emitting diode connected between the fourth transistor and a low level voltage, and a second light emitting diode connected between the fifth transistor and the low level voltage.

In another aspect, during a first time period, the (n−1)th gate signal has a low logic voltage and the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state. During a second time period, the (n−1)th gate signal and the first emission signal have a high logic voltage and the nth gate signal has a low logic voltage, the second and third emission signals have a low logic voltage for the first and second light emitting diodes of an ON state, and the second and third emission signals have a low logic voltage for the first and second light emitting diodes of an OFF state. During a third time period, the (n−1)th gate signal, the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state. During a fourth time period, the (n−1)th gate signal and the nth gate signal have a high logic voltage and the first emission signal has a low logic voltage, the second and third emission signals has a low logic voltage for the first and second light emitting diodes of an ON state, and the second and third emission signals have a high logic voltage for the first and second light emitting diodes of an OFF state.

In one aspect, a display device includes a display panel including a subpixel having first and second light emitting diodes operating in one of an ON state and an OFF state using a data signal, a gate signal, first to third emission signals, a half cylindrical lens, and a half spherical lens corresponding to the first and second light emitting diodes, respectively, a data driver configured to generate the data signal, and a gate driver including a gate signal generator configured to generate the gate signal, a first emission signal generator configured to generate the first emission signal, and second and third emission signal generators configured to generate the second and third emission signals, respectively, using input and output signals of the gate signal generator and input and output signals of the first emission signal generator.

In another aspect, the gate signal includes a gate1 signal and a gate2 signal, wherein the gate signal generator is configured to generate the includes a first component configured to generate the gate1 signal and a second component configured to generate the gate2 signal. The second emission signal generator is configured to generate one of the first emission signal of the output signal of the first emission signal generator and a high logic voltage of the input signal of the first emission signal generator as the second emission signal. The third emission signal generator is configured to generate one of the first emission signal of the output signal of the first emission signal generator and a high logic voltage of the input signal of the first emission signal generator as the third emission signal.

In another aspect, the second emission signal generator is configured to generate one of the gate signal of the output signal of the gate signal generator and a low logic voltage of the input signal of the first emission signal generator as the second emission signal. The third emission signal generator is configured to generate one of the gate signal of the output signal of the gate signal generator and a low logic voltage of the input signal of the first emission signal generator as the third emission signal.

In one aspect, a display device with a switchable viewing angle includes a controller configured to generate an image data, a data control signal, and a gate control signal, a data driver configured to generate a data signal using the image data and the data control signal, a gate driver configured to generate a gate signal and first to third emission signals using the gate control signal and at least two transistors, and a display panel configured to display an image using the data signal, the gate signal, and the first to third emission signals. The gate driver is configured to cause switching of a viewing angle of the image between a wide viewing angle and a narrow viewing angle using the first to third emission signals.

In another aspect, the gate driver includes a gate signal generator configured to generate the gate signal, a first emission signal generator configured to generate the first emission signal, a second emission signal generator configured to generate the second emission signal, and a third emission signal generator configured to generate the third emission signal, wherein the second emission signal and the third emission signal are generated using input and output signals of the gate signal generator and input and output signals of the first emission signal generator.

In another aspect, the display panel includes a plurality of subpixels, an array layer including a plurality of transistors, a storage capacitor and first and second light emitting diodes in each of the plurality of subpixels, a touch layer over the array layer, a lens layer over the touch layer and including a plurality of half cylindrical lenses corresponding to the first light emitting diode and a plurality of half spherical lenses corresponding to the second light emitting diode, and a polarizing layer over the lens layer and including a linear polarizing layer and a retardation layer.

In another aspect, each of the plurality of subpixels is formed of a red subpixel, a green, and a blue subpixel, and a first number of the plurality of half spherical lenses in the green subpixel is greater than a second number of the plurality of half spherical lenses in the red subpixel and the first number of the plurality of half spherical lenses is smaller than a third number of the plurality of half spherical lenses in the blue subpixel.

In another aspect, each of the plurality of subpixels is formed of a red subpixel, a green, and a blue subpixel, and a first anode of the first light emitting diode and a second anode of the second light emitting diode in the red subpixel of adjacent pixels are disposed between a first anode of the first light emitting diode and a second anode of the second light emitting diode in the blue subpixel.

In one aspect, a viewing angle switchable display device includes: a timing controlling unit generating an image data, a data control signal and a gate control signal; a data driving unit generating a data signal using the image data and the data control signal; a gate driving unit generating a gate signal and first to third emission signals using the gate control signal; and a display panel including a plurality of subpixels and displaying an image using the data signal, the gate signal and the first to third emission signals, wherein the gate driving unit includes: a gate signal generating part generating the gate signal; a first emission signal generating part generating the first emission signal; and second and third emission signal generating parts generating the second and third emission signals, respectively, using input and output signals of the gate signal generating part and input and output signals of the first emission signal generating part.

In another aspect, a viewing angle switchable display device includes: a display panel including a subpixel having first and second light emitting diodes operating as one of an ON state and an OFF state using a data signal, a gate signal and first to third emission signals and a half cylindrical lens and a half spherical lens corresponding to the first and second light emitting diodes, respectively; a data driving unit generating the data signal; a gate driving unit including a gate signal generating part generating the gate signal, a first emission signal generating part generating the first emission signal, and second and third emission signal generating parts generating the second and third emission signals, respectively, using input and output signals of the gate signal generating part and input and output signals of the first emission signal generating part.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Figure 1:
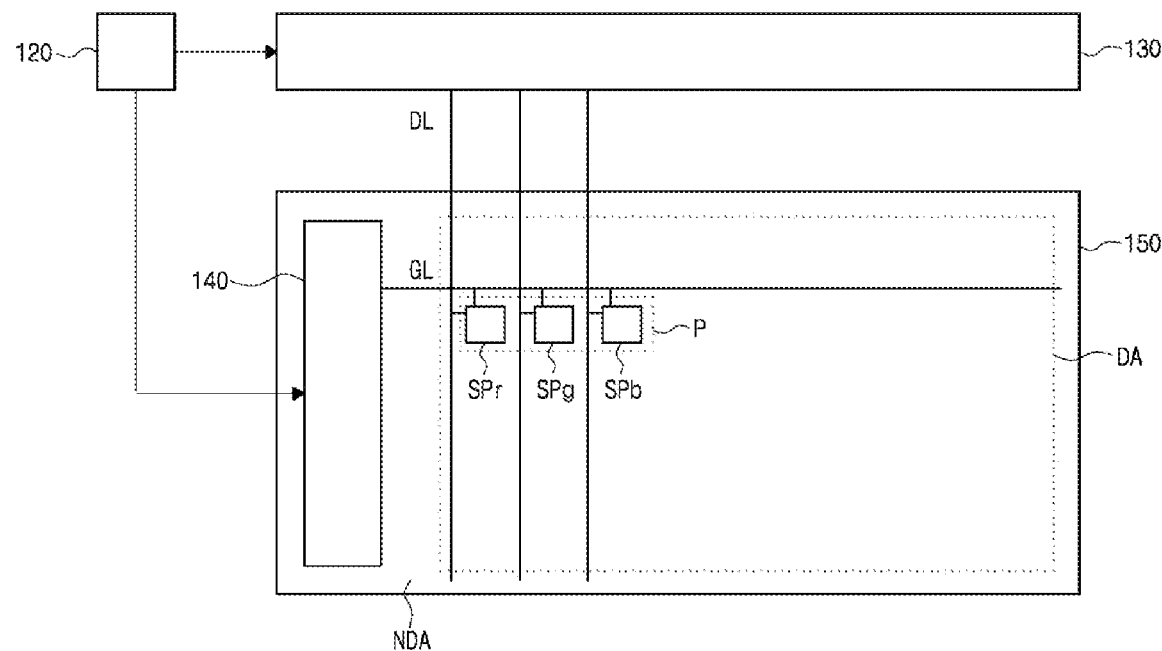
FIG. 1 is a plan view showing a viewing angle switchable display device according to some aspects of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Reference will now be made in detail to aspects of the disclosure, exemplary embodiments of which are illustrated in the accompanying drawings.

FIG. 1 is a plan view showing a viewing angle switchable display device according to some aspects of the present disclosure. The display device may be an organic light emitting diode (OLED) display device.

In FIG. 1, a viewing angle switchable display device 110 according to an example embodiment of the present disclosure includes a timing controlling unit 120, a data driving unit 130, a gate driving unit 140 and a display panel 150.

The timing controlling unit 120 (timing controller) generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 130 (data driver), and the gate control signal is transmitted to the gate driving unit 140.

The data driving unit 130 generates a data signal (data voltage) using the data control signal and the image data transmitted from the timing controlling unit 120 and transmits the data voltage to a data line DL of the display panel 150.

The gate driving unit 140 (gate driver) generates a gate signal (gate voltage) and an emission signal using the gate control signal transmitted from the timing controlling unit 120 and applies the gate signal and the emission signal to a gate line GL of the display panel 150.

The gate driving unit 140 may have a gate in panel (GIP) type to be formed in a non-display area NDA of a substrate of the display panel 150 having the gate line GL, the data line DL and a pixel P.

The display panel 150 includes a display area DA at a central portion thereof and a non-display area NDA surrounding the display area DA. The display panel 150 displays an image using the gate signal, the emission signal and the data signal. For displaying an image, the display panel 150 includes a plurality of pixels P, a plurality of gate lines GL and a plurality of data lines DL in the display area DA.

Each of the plurality of pixels P includes red, green and blue subpixels SPr, SPg and SPb, and the gate line GL and the data line DL cross each other to define the red, green and blue subpixels SPr, SPg and SPb. Each of the red, green and blue subpixels SPr, SPg and SPb is connected to the gate line GL and the data line DL.

When the viewing angle switchable display device 110 is an OLED display device, each of the red, green and blue subpixels SPr, SPg and SPb may include a plurality of transistors such as a switching transistor, a driving transistor and a sensing transistor, a storage capacitor and a light emitting diode.

A structure and an operation of the display panel 150 of the viewing angle switchable display device 110 will be illustrated with reference to drawings.

Figure 2:
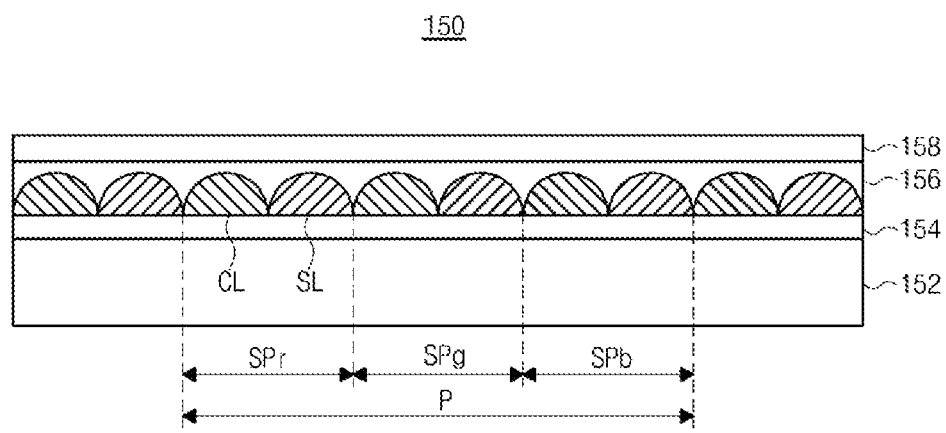
FIG. 2 is a cross-sectional view showing a display panel of a viewing angle switchable display device according to some aspects of the present disclosure.
Figure 3:
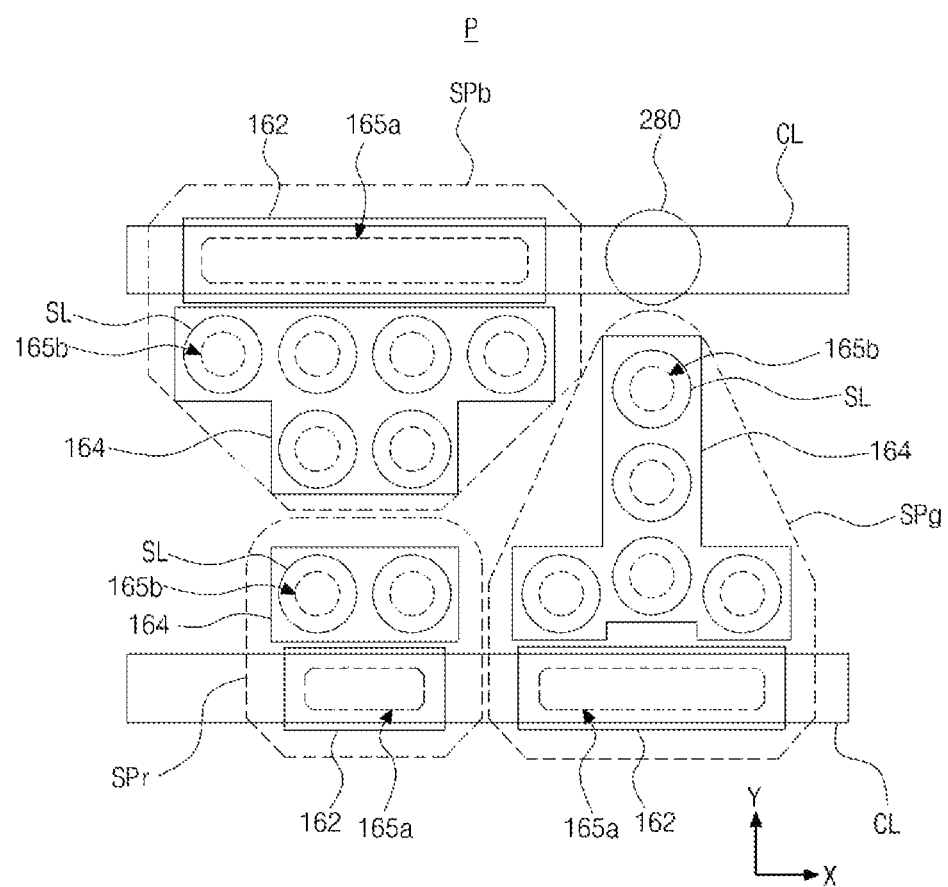
FIG. 3 is a view showing an electrode and a lens in a pixel of a display panel of a viewing angle switchable display device according to some aspects of the present disclosure.
Figure 4:
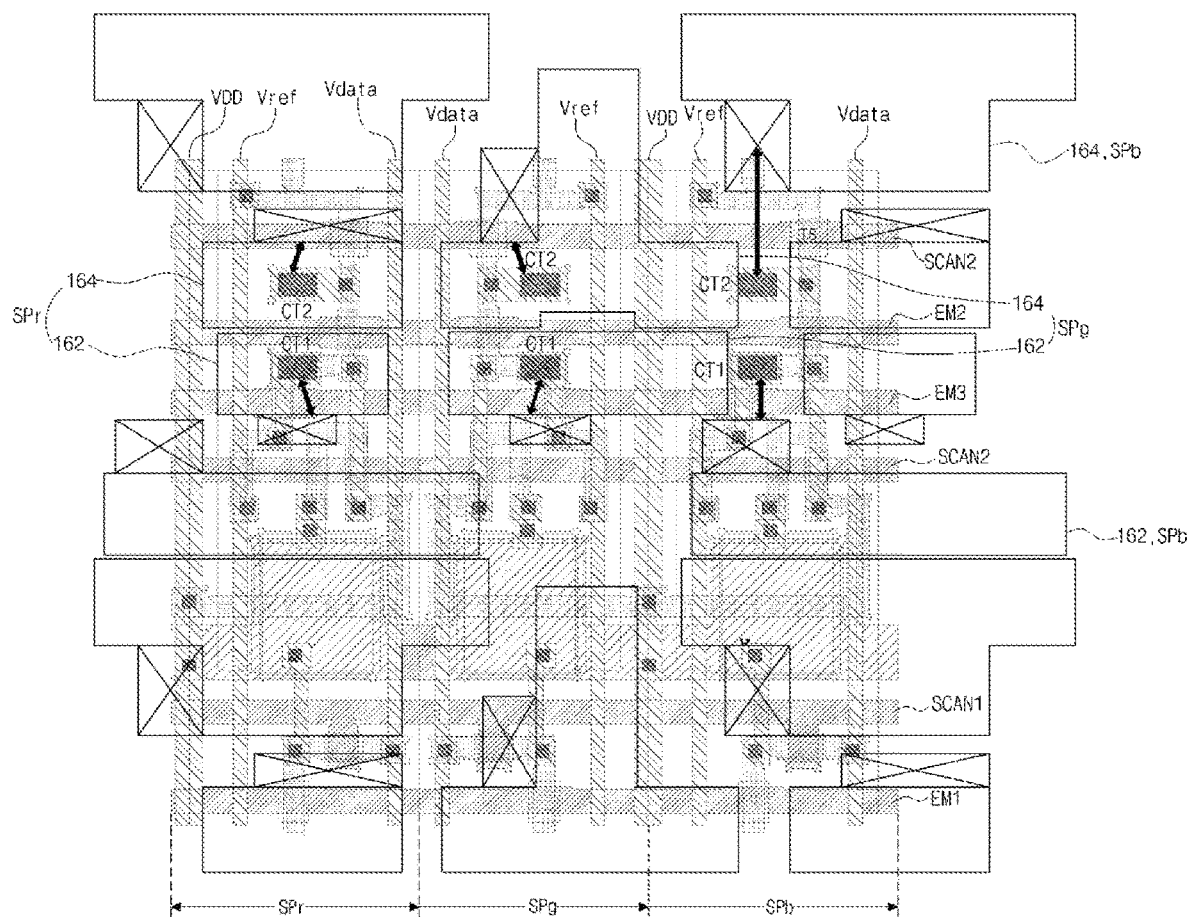
FIG. 4 is a plan view showing a pixel of a display panel of a viewing angle switchable display device according to some aspects of the present disclosure.
Figure 5:
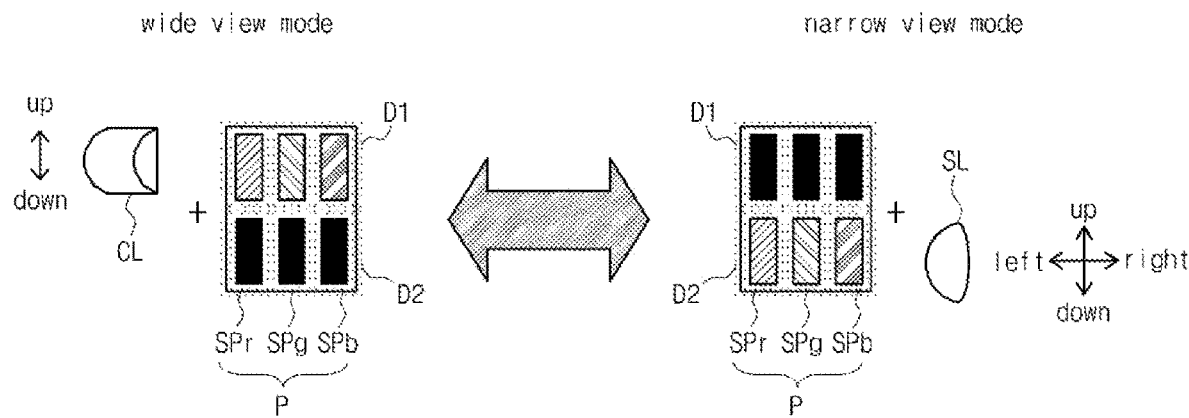
FIG. 5 is a view showing an operation in a wide view mode and a narrow view mode of a pixel of a display panel of a viewing angle switchable display device according to some aspects of the present disclosure.

FIG. 2 is a cross-sectional view showing a display panel of a viewing angle switchable display device according to some aspects of the present disclosure. FIG. 3 is a view showing an electrode and a lens in a pixel of a display panel of a viewing angle switchable display device according to some aspects of the present disclosure. FIG. 4 is a plan view showing a pixel of a display panel of a viewing angle switchable display device according to some aspects of the present disclosure. FIG. 5 is a view showing an operation in a wide view mode and a narrow view mode of a pixel of a display panel of a viewing angle switchable display device according to some aspects of the present disclosure.

In FIGS. 2 and 3, the display panel 150 of the viewing angle switchable display device 110 according to one example of the present disclosure includes an array layer 152, a touch layer 154, a lens layer 156 and a polarizing layer 158.

The array layer 152 includes the display area DA where the plurality of pixels P are disposed and the non-display area NDA where the gate driving unit 140 is disposed. The non-display area NDA surrounds the display area DA, and each of the plurality of pixels P includes the red, green and blue subpixels SPr, SPg and SPb.

For example, an area of the green subpixel SPg may be greater than an area of the red subpixel SPr and smaller than an area of the blue subpixel SPb based on a lifetime of an emitting layer. Further, the red subpixel SPr may have a tetragonal shape, and each of the green and blue subpixels SPg and SPb may have a pentagonal shape.

The array layer 154 includes a substrate and a plurality of transistors T1 to T8 (of FIG. 5), a storage capacitor Cst (of FIG. 5) and first and second light emitting diodes D1 and D2 (of FIG. 5) in each of the red, green and blue subpixels SPr, SPg and SPb on the substrate. Each of the first and second light emitting diodes D1 and D2 may include an anode, an emitting layer and a cathode sequentially disposed over the substrate.

A plurality of half cylindrical lenses CL are disposed to correspond to a first anode 162 of the first light emitting diode D1 of the red, green and blue subpixels SPr, SPg and SPb, and a plurality of half spherical lenses SL are disposed to correspond to a second anode 164 of the second light emitting diode D2.

As a result, the plurality of half cylindrical lenses CL are disposed to correspond to a first opening 165a of a bank layer on the emitting layer, and the plurality of half spherical lenses SL are disposed to correspond to a second opening 165b of the bank layer on the emitting layer.

Each half cylindrical lens CL extends along an x-direction such that the single half cylindrical lens CL corresponds to the first opening 165a of the adjacent red, green and blue subpixels SPr, SPg and SPb, and an area of the half cylindrical lens CL may be greater than an area of the first opening 165a.

For example, one half cylindrical lens CL may be disposed to correspond to the first anode 162 of the first light emitting diode D1 of the red and green subpixels SPr and SPg, and the other half cylindrical lens CL may be disposed to correspond to the first anode 162 of the first light emitting diode D1 of the blue subpixel SPb. The other half cylindrical lens CL may extend to the first anode 162 of the first light emitting diode D1 of an adjacent blue subpixel SPb along the x-direction.

As a result, a single half cylindrical lens CL corresponds to a plurality of first emission parts of the adjacent subpixels SPr, SPg and SPb along the x-direction.

For example, one half cylindrical lens CL may correspond to the first emission part of the adjacent red and green subpixels SPr and SPg along the x-direction, and the other half cylindrical lens CL may correspond to the first emission part of the adjacent blue subpixels SPb along the x-direction.

Each half spherical lens SL is disposed to correspond to the second opening 165b, and the plurality of half spherical lenses SL are disposed on the second anode 164 of the second light emitting diode D2. The area of the half spherical lens SL may be greater than the area of the second opening 165b.

As a result, the plurality of half spherical lenses SL correspond to the second emission part of each of the red, green and blue subpixels SPr, SPg and SPb.

Based on the lifetime of the emitting layer, the area of the green subpixel SPg may be greater than the area of the red subpixel SPr and smaller than the area of the blue subpixel SPb. As a result, the number of the plurality of half spherical lenses SL in the green subpixel SPg may be greater than the number of the plurality of half spherical lenses SL in the red subpixel SPr and smaller than the number of the plurality of half spherical lenses SL in the blue subpixels SPb.

A spacer 280 may be disposed in a region adjacent to the first anode 162 of the blue subpixel SPb along the x-direction and the second anode 164 of the green subpixel SPg along the y-direction, and the other half cylindrical lens CL may be disposed to overlap the spacer 280.

The spacer 280 may support a fine metal mask while the emitting layer is formed through an evaporation process. When the emitting layer is formed through a solution process, the spacer 280 may be omitted.

The touch layer 154 includes a plurality of transmitting electrodes and a plurality of receiving electrodes. A touch may be sensed from a variation of a capacitance between the plurality of transmitting electrodes and the plurality of receiving electrodes.

The lens layer 156 includes the plurality of half cylindrical lenses CL and the plurality of half spherical lenses SL. The plurality of half cylindrical lenses CL may be disposed to correspond to the first light emitting diode D1 of each of the red, green and blue subpixels SPr, SPg and SPb, and the plurality of half spherical lenses SL may be disposed to correspond to the second light emitting diode D2 of each of the red, green and blue subpixels SPr, SPg and SPb.

The polarizing layer 158 may include a linear polarizing layer and a retardation layer. The polarizing layer 158 converts a polarization state of an external light incident to the display panel 150 to prevent re-emission of the external light to an exterior.

FIG. 4 shows a connection relation of a contact part and the emission part of each subpixel. The emission part corresponds to the anode of the light emitting diode, and each line transmitting a signal is designated by the corresponding signal.

In FIG. 4, the red and blue subpixels SPr and SPb have the same structure as each other, and the green subpixel SPg has a symmetrical structure with each of the red and blue subpixels SPr and SPb. Two subpixels having the same structure as the red and green subpixels SPr and SPg symmetrical to each other are repeatedly disposed.

A first contact part CT1 corresponding to a drain electrode of a second transistor T2 (of FIG. 6) in the red subpixel SPr is connected to the first anode 162 in the red subpixel SPr, and a second contact part CT2 corresponding to a drain electrode of a third transistor T3 (of FIG. 6) in the red subpixel SPr is connected to the second anode 164 in the red subpixel SPr. The first contact part CT1 corresponding to the drain electrode of the second transistor T2 in the green subpixel SPg is connected to the first anode 162 in the green subpixel SPg, and the second contact part CT2 corresponding to the drain electrode of the third transistor T3 in the green subpixel SPg is connected to the second anode 164 in the green subpixel SPg. The first contact part CT1 corresponding to the drain electrode of the second transistor T2 in the blue subpixel SPb is connected to the first anode 162 in the blue subpixel SPb, and the second contact part CT2 corresponding to the drain electrode of the third transistor T3 in the blue subpixel SPb is connected to the second anode 164 in the blue subpixel SPb.

The first and second anodes 162 and 164 of the red subpixel SPr of the other pixel may be disposed between the first and second anodes 162 and 164 in the blue subpixel SPb, and the first and second contact parts CT1 and CT2 of the blue subpixel SPb may be disposed between the first and second anodes 162 and 164 in the blue subpixel SPb. As a result, a degree of design freedom is improved.

In another embodiment, the first and second anodes 162 and 164 of the blue subpixel SPb may be disposed between the first anode 162 of the red subpixel SPr of another pixel and the second anode 164 of the red subpixel SPr of the other pixel, and the first contact part CT1 of the blue subpixel SPb and the first anode 162 connected thereto may be disposed between the second contact part CT2 of the blue subpixel SPb and the second anode 164 thereto.

In FIG. 5, when the display panel 150 operates in the wide view mode, the first light emitting diode D1 of each of the red, green and blue subpixels SPr, SPg and SPb has an ON state to emit a light, and the second light emitting diode D2 of each of the red, green and blue subpixels SPr, SPg and SPb has an OFF state not to emit a light.

As a result, the light of the first light emitting diode D1 emitted from the display panel 150 through the plurality of half cylindrical lenses CL to be focused along an up-down direction and be diffused along a left-right direction. Accordingly, the viewing angle switchable display device 110 displays an image having a narrow viewing angle along the up-down direction and a wide viewing angle along the left-right direction.

When the display panel 150 operates in the narrow view mode, the first light emitting diode D1 of each of the red, green and blue subpixels SPr, SPg and SPb has an OFF state not to emit a light, and the second light emitting diode D2 of each of the red, green and blue subpixels SPr, SPg and SPb has an ON state to emit a light.

As a result, the light of the second light emitting diode D2 emitted from the display panel 150 through the plurality of half spherical lenses SL to be focused along the up-down and left-right directions. Accordingly, the viewing angle switchable display device 110 displays an image having a narrow viewing angle along the up-down and left-right directions.

The viewing angle switchable display device 110 displays an image having a wide viewing angle along the left-right direction in the wide view mode and displays an image having a narrow viewing angle along the left-right direction in the narrow view mode. As a result, both of a driver and a passenger may watch an image in the wide view mode, and one of a driver and a passenger may watch an image in the narrow view mode.

Since the viewing angle switchable display device 110 displays an image having a narrow viewing angle along the up-down direction in the wide and narrow view modes, obstruction of a driver's view due to reflection of the image on a windscreen is prevented.

A structure and an operation of the subpixel and the gate driving unit of the viewing angle switchable display device 110 will be illustrated with reference to drawings.

Figure 6:
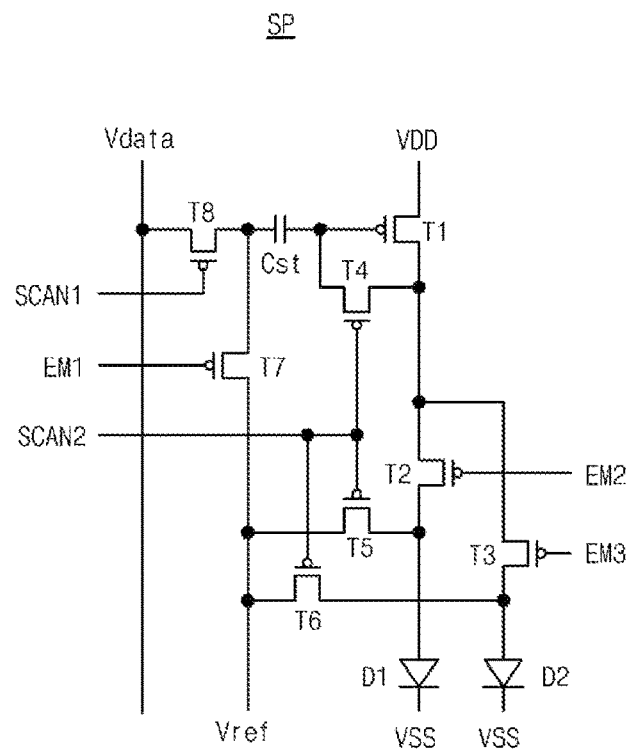
FIG. 6 is a circuit diagram showing a subpixel of a viewing angle switchable display device according to some aspects of the present disclosure.
Figures 7, 8:
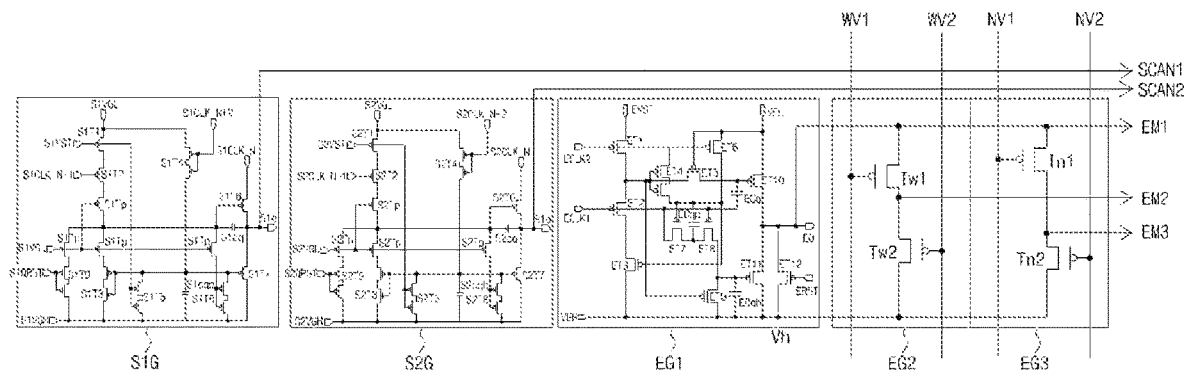
FIG. 7 is a circuit diagram showing a gate driving unit of a viewing angle switchable display device according to some aspects of the present disclosure.
FIG. 8 is a view showing a plurality of signals used in a subpixel and a gate driving unit of a viewing angle switchable display device according to some aspects of the present disclosure.

FIG. 6 is a circuit diagram showing a subpixel of a viewing angle switchable display device according to some aspects of the present disclosure. FIG. 7 is a circuit diagram showing a gate driving unit of a viewing angle switchable display device according to some aspects of the present disclosure. FIG. 8 is a view showing a plurality of signals used in a subpixel and a gate driving unit of a viewing angle switchable display device according to some aspects of the present disclosure.

In FIG. 6, each of the red, green and blue subpixels SPr, SPg and SPb of the display panel 150 of the viewing angle switchable display device 110 according to one example embodiment of the present disclosure includes the first to eighth transistors T1 to T8, the storage capacitor Cst and the first and second light emitting diodes D1 and D2.

For example, the first to eighth transistors T1 to T8 may have a positive type.

The first transistor T1 of a driving transistor is switched (turned on and off) according to a voltage of a first electrode of the storage capacitor Cst. A gate electrode of the first transistor T1 is connected to the first electrode of the storage capacitor Cst and a drain electrode of the fourth transistor T4, a source electrode of the first transistor T1 is connected to a high level voltage VDD, and a drain electrode of the first transistor T1 is connected to a source electrode of the fourth transistor T4, a source electrode of the second transistor T2 and a source electrode of the third transistor T3.

The second transistor T2 of an emission transistor is switched according to a second emission signal EM2. A gate electrode of the second transistor T2 is connected to the second emission signal EM2, the source electrode of the second transistor T2 is connected to the drain electrode of the first transistor T1, the source electrode of the fourth transistor T4 and the source electrode of the third transistor T3, and a drain electrode of the second transistor T2 is connected to a source electrode of the fifth transistor T5 and an anode of the first light emitting diode D1.

The third transistor T3 of an emission transistor is switched according to a third emission signal EM3. A gate electrode of the third transistor T3 is connected to the third emission signal EM3, the source electrode of the third transistor T3 is connected to the drain electrode of the first transistor T1, the source electrode of the fourth transistor T4 and the source electrode of the second transistor T2, and a drain electrode of the third transistor T3 is connected to a source electrode of the sixth transistor T6 and an anode of the second light emitting diode D2.

The fourth transistor T4 is switched according to a gate2 signal SCAN2. A gate electrode of the fourth transistor T4 is connected to the gate2 signal SCAN2, the source electrode of the fourth transistor T4 is connected to the drain electrode of the first transistor T1, the source electrode of the second transistor T2 and the source electrode of the third transistor T3, and the drain electrode of the fourth transistor T4 is connected to the gate electrode of the first transistor T1 and the first electrode of the storage capacitor Cst.

The fifth transistor T5 is switched according to the gate2 signal SCAN2. A gate electrode of the fifth transistor T5 is connected to the gate2 signal SCAN2, the source electrode of the fifth transistor T5 is connected to the drain electrode of the second transistor T2 and the anode of the first light emitting diode D1, and a drain electrode of the fifth transistor T5 is connected to a drain electrode of the seventh transistor T7, a drain electrode of the sixth transistor T6 and a reference signal Vref.

The sixth transistor T6 is switched according to the gate2 signal SCAN2. A gate electrode of the sixth transistor T6 is connected to the gate2 signal SCAN2, the source electrode of the sixth transistor T6 is connected to the drain electrode of the third transistor T3 and the anode of the second light emitting diode D2, and a drain electrode of the sixth transistor T6 is connected to the drain electrode of the seventh transistor T7, the drain electrode of the fifth transistor T5 and the reference signal Vref.

The seventh transistor T7 is switched according to a gate1 signal SCAN1. A gate electrode of the seventh transistor T7 is connected to the gate1 signal SCAN1, a source electrode of the seventh transistor T7 is connected to a second electrode of the storage capacitor Cst and a source electrode of the eighth transistor T8, and the drain electrode of the seventh transistor T7 is connected to the drain electrode of the fifth transistor T5 and the drain electrode of the sixth transistor T6.

The eighth transistor T8 of a switching transistor is switched according to the gate1 signal SCAN1. A gate electrode of the eighth transistor T8 is connected to the gate1 signal SCAN1, the source electrode of the eighth transistor T8 is connected to the second electrode of the storage capacitor Cst and the source electrode of the seventh transistor T7, and a drain electrode of the eighth transistor T8 is connected to the data signal Vdata.

The storage capacitor Cst stores the data signal Vdata and a threshold voltage Vth. The first electrode of the storage capacitor Cst is connected to the gate electrode of the first transistor T1 and the drain electrode of the fourth transistor T4, and the second electrode of the storage capacitor Cst is connected to the source electrode of the seventh transistor T7 and the source electrode of the eighth transistor T8.

The first light emitting diode D1 is connected between the second and fifth transistors T2 and T5 and the low level voltage VSS and emits a light proportional to a current of the first transistor T1. The anode of the first light emitting diode D1 is connected to the drain electrode of the second transistor T2 and the source electrode of the fifth transistor T5, and the cathode of the first light emitting diode D1 is connected to the low level voltage VSS. The first light emitting diode D1 is disposed to correspond to the plurality of half cylindrical lenses CL. The first light emitting diode D1 has an ON state to obtain a wide view mode along the left-right direction and has an OFF state to obtain a narrow view mode along the left-right direction.

The second light emitting diode D2 is connected between the third and sixth transistors T3 and T6 and the low level voltage VSS and emits a light proportional to the current of the first transistor T1. The anode of the second light emitting diode D2 is connected to the drain electrode of the third transistor T3 and the source electrode of the sixth transistor T6, and the cathode of the second light emitting diode D2 is connected to the low level voltage VSS. The second light emitting diode D2 is disposed to correspond to the plurality of half spherical lenses SL. The second light emitting diode D2 has an ON state to obtain a narrow view mode along the left-right direction.

In FIG. 7, the gate driving unit 140 of the viewing angle switchable display device 110 according to an example embodiment of the present disclosure includes a gate1 signal generating part S1G (a first component), a gate2 signal generating part S2G (a second component), a first emission signal generating part EG1 (first emission signal generator), a second emission signal generating part EG2 (a second emission signal generator) and a third emission signal generating part EG3 (a third emission signal generator). In one example, a single signal generator may generate the first, the second, and the third emission signals.

The gate1 signal generating part S1G, the gate2 signal generating part S2G, the first emission signal generating part EG1, the second emission signal generating part EG2 and the third emission signal generating part EG3 are connected to one horizontal pixel line of the display panel 150. The gate1 signal generating part S1G, the gate2 signal generating part S2G and the first emission signal generating part EG1 having the same structure are disposed as previous and next stages of the gate1 signal generating part S1G, the gate2 signal generating part S2G and the first emission signal generating part EG1 and are connected to the gate1 signal generating part S1G, the gate2 signal generating part S2G and the first emission signal generating part EG1 in a cascade type. The plurality of stages of the gate1 signal generating part SIG, the gate2 signal generating part S2G and the first emission signal generating part EG1 may be connected to the plurality of horizontal pixel lines.

For example, the gate1 signal generating part S1G, the gate2 signal generating part S2G and the first emission signal generating part EG1 may correspond to one stage of a shift register.

Further, the second emission signal generating part EG2 and the third emission signal generating part EG3 having the same structure are disposed as previous and next stages of the second emission signal generating part EG2 and the third emission signal generating part EG3. The plurality of stages of the second emission signal generating part EG2 and the third emission signal generating part EG3 may be connected to the plurality of horizontal pixel lines.

The gate1 signal generating part S1G includes first to ninth gate1 transistors S1T1 to S1T9, four gate1 pass transistors S1Tp, a gate1q capacitor S1Cq and a gate1qb capacitor S1Cqb. The gate1 signal generating part S1G generates a gate1 output signal S1O as the gate1 signal SCAN1 using a gate1 start signal S1VST (or a previous gate1 output signal), a gate1 high signal S1VGH, a gate1 low signal S1VGL, a gate1 reset signal S1QRST, and (N−1)th, (N)th and (N+2)th gate1 clocks S1CLKN−1, S1CLKN and S1CLKN+2 and supplies the gate1 signal SCAN1 to an nth horizontal pixel line of the display panel 150.

For example, the first to ninth gate1 transistors S1T1 to S1T9 and the four gate1 pass transistors S1Tp may have a positive type. The gate1 start signal S1VST, the gate1 reset signal S1QRST and the (N−1)th, (N)th and (N+2)th gate1 clocks S1CLKN−1, S1CLKN and S1CLKN+2 may be supplied by the timing controlling unit 120, and the gate1 high signal S1VGH and the gate1 low signal S1VGL may be supplied by a power unit.

The gate2 signal generating part S2G includes first to ninth gate2 transistors S2T1 to S2T9, four gate2 pass transistors S2Tp, a gate2q capacitor S2Cq and a gate2qb capacitor S2Cqb. The gate2 signal generating part S2G generates a gate2 output signal S2O as the gate2 signal SCAN2 using a gate2 start signal S2VST (or a previous gate2 output signal), a gate2 high signal S2VGH, a gate2 low signal S2VGL, a gate2 reset signal S2QRST, and (N−1)th, (N)th and (N+2)th gate2 clocks S2CLKN−1, S2CLKN and S2CLKN+2 and supplies the gate2 signal SCAN2 to the nth horizontal pixel line of the display panel 150.

For example, the first to ninth gate2 transistors S2T1 to S2T9 and the four gate2 pass transistors S2Tp may have a positive type. The gate2 start signal S2VST, the gate2 reset signal S2QRST and the (N−1)th, (N)th and (N+2)th gate2 clocks S2CLKN−1, S2CLKN and S2CLKN+2 may be supplied by the timing controlling unit 120, and the gate2 high signal S2VGH and the gate2 low signal S2VGL may be supplied by the power unit.

The first emission signal generating part EG1 includes first to twelfth emission transistors ET1 to ET12, an emission-q capacitor ECq, an emission-qp capacitor ECqp and an emission-qb capacitor ECqb. The first emission signal generating part EG1 generates an emission output signal EO as the first emission signal EM1 using an emission start signal EVST (or a previous emission output signal), an emission high signal VEH, an emission low signal VEL, an emission reset signal ERST, and first and second emission clocks ECLK1 and ECLK2 and supplies the first emission signal EM1 to the nth horizontal pixel line of the display panel 150.

For example, the first to twelfth emission transistors ET1 to ET12 may have a positive type. The emission start signal EVST, the emission reset signal ERST and the first and second emission clocks ECLK1 and ECLK2 may be supplied by the timing controlling unit 120, and the emission high signal VEH and the emission low signal VEL may be supplied by the power unit.

The second emission signal generating part EG2 includes a first wide view transistor Tw1 and a second wide view transistor Tw2. The second emission signal generating part EG2 generates the first emission signal EM1 of the emission output signal EO of the first emission signal generating part EG1 or a high logic voltage Vh of the emission high signal VEH of the first emission signal generating part EG1 as the second emission signal EM2 using a first wide view signal WV1 and a second wide view signal WV2 and supplies the second emission signal EM2 to the nth horizontal pixel line of the display panel 150.

For example, the first wide view transistor Tw1 and the second wide view transistor Tw2 may have a positive type. The first wide view signal WV1 and the second wide view signal WV2 may have opposite polarities and may be supplied by the timing controlling unit 120 or the power unit.

The first wide view transistor Tw1 is switched according to the first wide view signal WV1. A gate electrode of the first wide view transistor Tw1 is connected to the first wide view signal WV1, a source electrode of the first wide view transistor Tw1 is connected to the first emission signal EM1, and a drain electrode of the first wide view transistor Tw1 is connected to a source electrode of the second wide view transistor Tw2.

The second wide view transistor Tw2 is switched according to the second wide view signal WV2. A gate electrode of the second wide view transistor Tw2 is connected to the second wide view signal WV2, the source electrode of the second wide view transistor Tw2 is connected to the drain electrode of the first wide view transistor Tw1, and a drain electrode of the second wide view transistor Tw2 is connected to a high logic voltage Vh.

The second emission signal EM2 is outputted from a connection node between the drain electrode of the first wide view transistor Tw1 and the source electrode of the second wide view transistor Tw2.

The third emission signal generating part EG3 includes a first narrow view transistor Tn1 and a second narrow view transistor Tn2. The third emission signal generating part EG3 generates the first emission signal EM1 of the emission output signal EO of the first emission signal generating part EG1 or a high logic voltage Vh of the emission high signal VEH of the first emission signal generating part EG1 as the third emission signal EM3 using a first narrow view signal NV1 and a second narrow view signal NV2 and supplies the third emission signal EM3 to the nth horizontal pixel line of the display panel 150.

For example, the first narrow view transistor Tn1 and the second narrow view transistor Tn2 may have a positive type. The first narrow view signal NV1 and the second narrow view signal NV2 may have opposite polarities and may be supplied by the timing controlling unit 120 or the power unit.

The first narrow view transistor Tn1 is switched according to the first narrow view signal NV1. A gate electrode of the first narrow view transistor Tn1 is connected to the first narrow view signal NV1, a source electrode of the first narrow view transistor Tn1 is connected to the first emission signal EM1, and a drain electrode of the first narrow view transistor Tn1 is connected to a source electrode of the second narrow view transistor Tn2.

The second narrow view transistor Tn2 is switched according to the second narrow view signal NV2. A gate electrode of the second narrow view transistor Tn2 is connected to the second narrow view signal NV2, the source electrode of the second narrow view transistor Tn2 is connected to the drain electrode of the first narrow view transistor Tn1, and a drain electrode of the second narrow view transistor Tn2 is connected to a high logic voltage Vh.

The third emission signal EM3 is outputted from a connection node between the drain electrode of the first narrow view transistor Tn1 and the source electrode of the second narrow view transistor Tn2.

In FIG. 8, during a first time period TP1 of an initial period, the gate1 signal SCAN1 and the first emission signal EM1 become a low logic voltage Vl, and the gate2 signal SCAN2 becomes a high logic voltage Vh. The seventh and eighth transistors T7 and T8 are turned on and the fourth, fifth and sixth transistors T4, T5 and T6 are turned off, and the second electrode of the storage capacitor Cst becomes the reference signal Vref such that the gate electrode of the first transistor T1 is initialized.

During the first time period TP1 of an initial period, when the first and second light emitting diodes D1 and D2 operate as an ON state, the first wide view signal WV1 and the first narrow view signal NV1 become a low logic voltage Vl. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the first emission signal EM1, and the second and third transistors T2 and T3 are turned on.

During the first time period TP1 of an initial period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the emission high signal VEH, and the second and third transistors T2 and T3 are turned off.

During a second time period TP2 of a sensing period, the gate1 signal SCAN1 and the gate2 signal SCAN2 become a low logic voltage Vl, and the first emission signal EM1 becomes a high logic voltage Vh. The fourth, fifth, sixth and eighth transistors T4, T5, T6 and T8 are turned on and the seventh transistor T7 is turned off. The second electrode of the storage capacitor Cst becomes the data signal Vdata, and the first electrode of the storage capacitor Cst becomes a sum (Vdata−Vref+Vth) of a difference (Vdata−Vref) between the data signal Vdata and the reference voltage Vref and the threshold voltage Vth such that the threshold voltage Vth is stored in the storage capacitor Cst.

During the second time period TP2 of a sensing period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a high logic voltage Vh due to the first emission signal EM1, and the second and third transistors T2 and T3 are turned off.

During the second time period TP2 of a sensing period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the emission high signal VEH, and the second and third transistors T2 and T3 are turned off.

During a third time period TP3 of a holding period, the gate1 signal SCAN1, the gate2 signal SCAN2 and the first emission signal EM1 become a high logic voltage Vh. The fourth, fifth, sixth, seventh and eighth transistors T4, T5, T6, T7 and T8 are turned off. The second electrode of the storage capacitor Cst is kept as the data signal Vdata, and the first electrode of the storage capacitor Cst is kept as the sum (Vdata−Vref+Vth) of a difference (Vdata-Vref) between the data signal Vdata and the reference voltage Vref and the threshold voltage Vth.

During the third time period TP3 of a holding period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a high logic voltage Vh due to the first emission signal EM1, and the second and third transistors T2 and T3 are turned off.

During the third time period TP3 of a holding period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the emission high signal VEH, and the second and third transistors T2 and T3 are turned off.

During a fourth time period TP4 of an emission period, the gate1 signal SCAN1 and the gate2 signal SCAN2 become a high logic voltage Vh, and the first emission signal EM1 becomes a low logic voltage Vl. The fourth, fifth, sixth and eighth transistors T4, T5, T6 and T8 are turned off, and the seventh transistor T7 is turned on. A current proportional to a square of a value ((Vdata−Vref+Vth−VDD)−Vth=Vdata−Vref−VDD) obtained by subtracting the threshold voltage Vth from a gate-source voltage Vgs flows through the first transistor T1, and the first and second light emitting diodes D1 and D2 emit a light having a luminance corresponding to the current flowing through the first transistor T1 according to ON and OFF states of the second and third transistors T2 and T3.

During the fourth time period TP4 of an emission period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the first emission signal EM1, and the second and third transistors T2 and T3 are turned on.

During the fourth time period TP4 of an emission period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the emission high signal VEH, and the second and third transistors T2 and T3 are turned off.

In the viewing angle switchable display device 110 according to one example embodiment of the present disclosure, the first and second light emitting diodes D1 and D2 emit a light according to an operation of the first to eighth transistors T1 to T8 and the storage capacitor Cst to display an image. As a result, a variation of the threshold voltage according to a use time or deterioration of the first and second light emitting diodes D1 and D2 is compensated using the subpixel SP, and a luminance is adjusted by driving the first and second light emitting diodes D1 and D2 according to a duty ratio corresponding to an emission time.

Further, since the first and second light emitting diodes D1 and D2 are driven as an ON state and an OFF state according to the second and third emission signals EM2 and EM3, respectively, a wide view mode and a narrow view mode are obtained. A wide view mode along a left-right direction is obtained by driving the first light emitting diode D1 as an ON state and driving the second light emitting diode D2 as an ON state or an OFF state, and a narrow view mode along a left-right direction is obtained by driving the first light emitting diode D1 as an OFF state and driving the second light emitting diode D2 as an ON state.

In addition, the second emission signal generating part EG2 generating the second emission signal EM2 for switching a viewing angle is formed by the first wide view transistor Tw1 and the second wide view transistor Tw2, and the third emission signal generating part EG3 generating the third emission signal EM3 for switching a viewing angle is formed by the first narrow view transistor Tn1 and the second narrow view transistor Tn2. As a result, a size of each of the second and third emission signal generating parts EG2 and EG3 is minimized and a size of the gate driving unit 140 is minimized. Accordingly, an area of the non-display area is reduced to obtain a narrow bezel.

Figure 9:
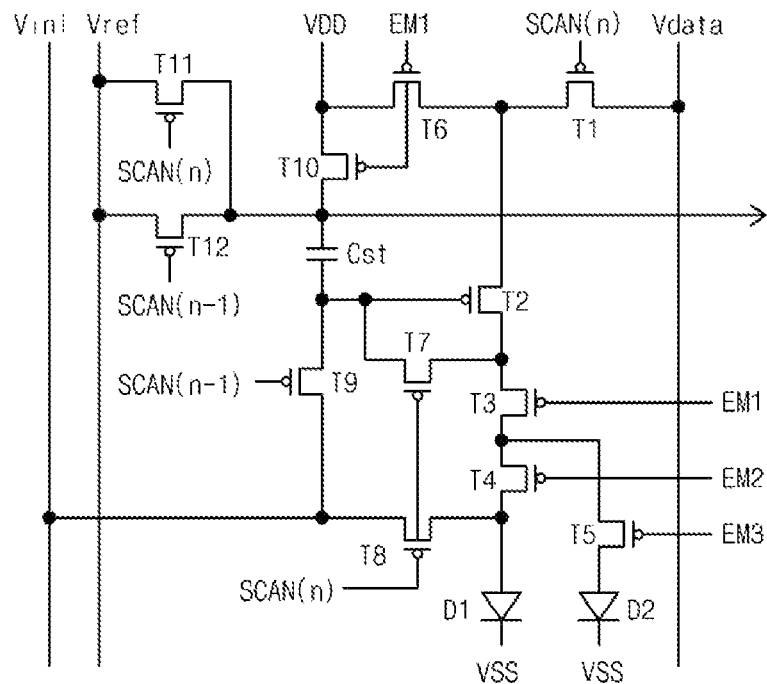
FIG. 9 is a circuit diagram showing a subpixel of a viewing angle switchable display device according to some aspects of the present disclosure.
Figure 10:
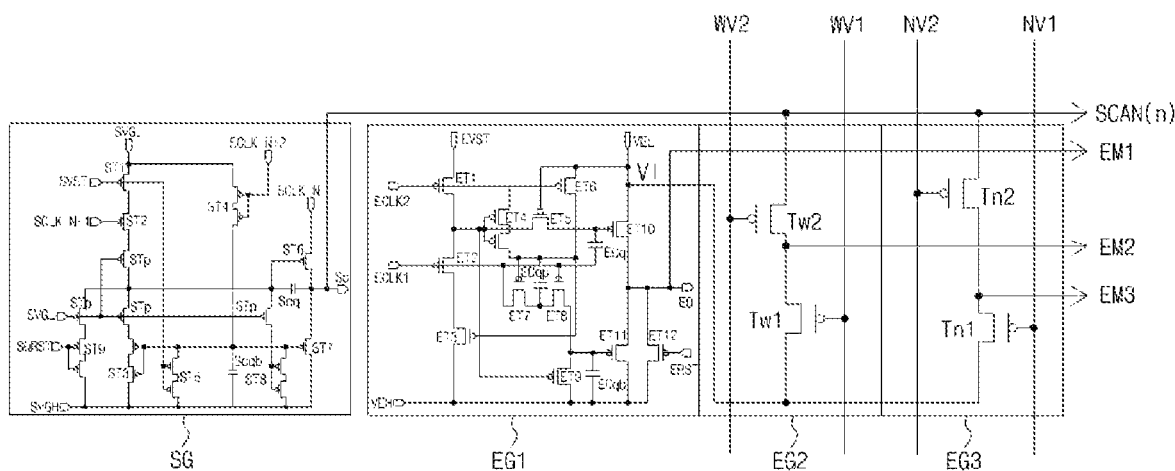
FIG. 10 is a circuit diagram showing a gate driving unit of a viewing angle switchable display device according to some aspects of the present disclosure.
Figure 11:
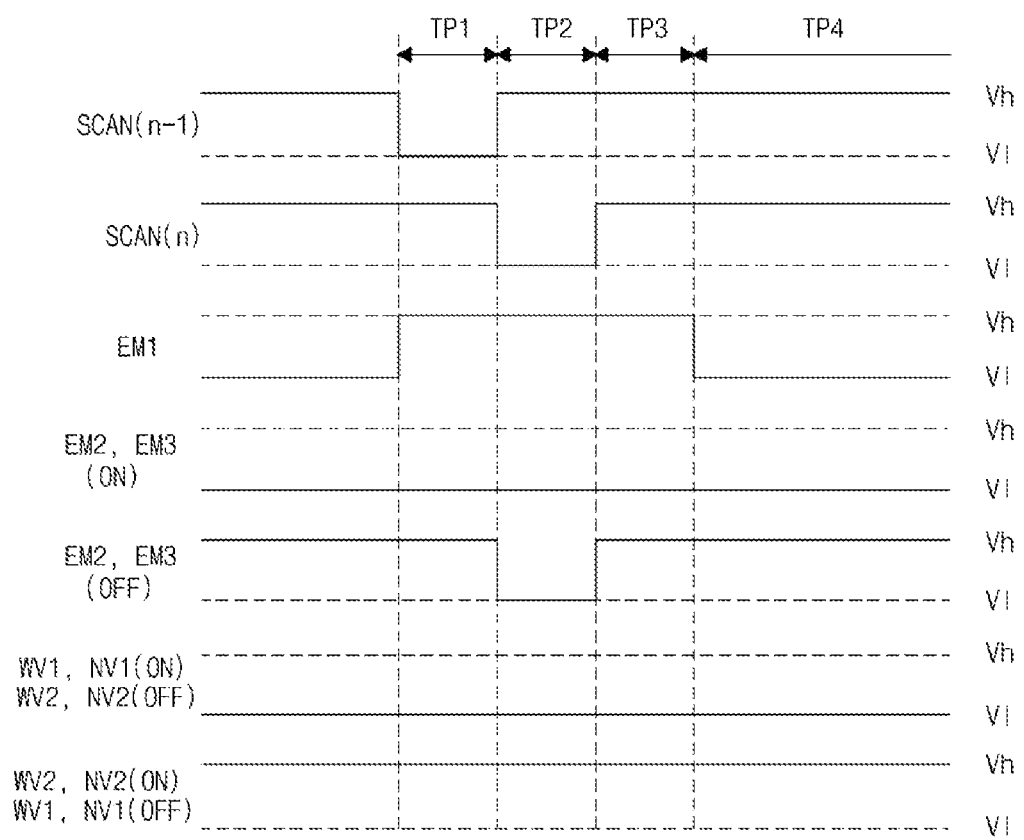
FIG. 11 is a view showing a plurality of signals used in a subpixel and a gate driving unit of a viewing angle switchable display device according to some aspects of the present disclosure.

FIG. 9 is a circuit diagram showing a subpixel of a viewing angle switchable display device according to some aspects of the present disclosure. FIG. 10 is a circuit diagram showing a gate driving unit of a viewing angle switchable display device according to some aspects of the present disclosure. FIG. 11 is a view showing a plurality of signals used in a subpixel and a gate driving unit of a viewing angle switchable display device according to some aspects of the present disclosure. Elements of example embodiments of FIGS. 9-11 that are the same as those of example embodiments of FIGS. 2-8 will not be described further and are omitted for sake of brevity.

In FIG. 9, each of the red, green and blue subpixels SPr, SPg and SPb of a display panel of a viewing angle switchable display device according to an example embodiment of the present disclosure includes first to twelfth transistors T1 to T12, a storage capacitor Cst and first and second light emitting diodes D1 and D2.

For example, the first to twelfth transistors T1 to T12 may have a positive type.

The first transistor T1 of a switching transistor is switched (turned on and off) according to an nth gate signal SCAN(n). A gate electrode of the first transistor T1 is connected to the nth gate signal SCAN(n), a source electrode of the first transistor T1 is connected to a data signal Vdata, and a drain electrode of the first transistor T1 is connected to a source electrode of the second transistor T2 and a source electrode of the sixth transistor T6.

The second transistor T2 of a driving transistor is switched according to a voltage of a first electrode of the storage capacitor Cst. A gate electrode of the second transistor T2 is connected to the first electrode of the storage capacitor Cst, a drain electrode of the seventh transistor T7 and a source electrode of the ninth transistor T9, the source electrode of the second transistor T2 is connected to the drain electrode of the first transistor T1 and a source electrode of the sixth transistor T6, and a drain electrode of the second transistor T2 is connected to a source electrode of the third transistor T3 and a source electrode of the seventh transistor T7.

The third transistor T3 of an emission transistor is switched according to a first emission signal EM1. A gate electrode of the third transistor T3 is connected to the first emission signal EM1, the source electrode of the third transistor T3 is connected to the drain electrode of the second transistor T2 and the source electrode of the seventh transistor T7, and a drain electrode of the third transistor T3 is connected to a source electrode of the fourth transistor T4 and a source electrode of the fifth transistor T5.

The fourth transistor T4 of an emission transistor is switched according to a second emission signal EM2. A gate electrode of the fourth transistor T4 is connected to the second emission signal EM2, the source electrode of the fourth transistor T4 is connected to the drain electrode of the third transistor T3 and the source electrode of the fifth transistor T5, and a drain electrode of the fourth transistor T4 is connected to a source electrode of the eighth transistor T8 and an anode of the first light emitting diode D1.

The fifth transistor T5 of an emission transistor is switched according to a third emission signal EM3. A gate electrode of the fifth transistor T5 is connected to the third emission signal EM3, the source electrode of the fifth transistor T5 is connected to the drain electrode of the third transistor T3 and the source electrode of the fourth transistor T4, and a drain electrode of the fifth transistor T5 is connected to an anode of the second light emitting diode D2.

The sixth transistor T6 is switched according to the first emission signal EM1. A gate electrode of the sixth transistor T6 is connected to the first emission signal EM1, the source electrode of the sixth transistor T6 is connected to the drain electrode of the first transistor T1 and the source electrode of the second transistor T2, and a drain electrode of the sixth transistor T6 is connected to a high level voltage VDD and a source electrode of the tenth transistor T10.

The seventh transistor T7 is switched according to the nth gate signal SCAN(n). A gate electrode of the seventh transistor T7 is connected to the nth gate signal SCAN(n), the source electrode of the seventh transistor T7 is connected to the drain electrode of the second transistor T2 and the source electrode of the third transistor T3, and the drain electrode of the seventh transistor T7 is connected to the gate electrode of the second transistor T2, the first electrode of the storage capacitor Cst and a source electrode of the ninth transistor T9.

The eighth transistor T8 is switched according to the nth gate signal SCAN(n). A gate electrode of the eighth transistor T8 is connected to the nth gate signal SCAN(n), a source electrode of the eighth transistor T8 is connected to the drain electrode of the fourth transistor T4 and the anode of the first light emitting diode D1, and a drain electrode of the eighth transistor T8 is connected to a drain electrode of the ninth transistor T9 and an initial signal Vini.

The ninth transistor T9 is switched according to the (n−1)th gate signal SCAN(n−1). A gate electrode of the ninth transistor T9 is connected to the (n−1)th gate signal SCAN(n−1), the source electrode of the ninth transistor T9 is connected to the first electrode of the storage capacitor Cst, the gate electrode of the second transistor T2 and the drain electrode of the seventh transistor T7, and the drain electrode of the ninth transistor T9 is connected to the drain electrode of the eighth transistor T8 and the initial signal Vini.

The tenth transistor T10 is switched according to the first emission signal EM1. A gate electrode of the tenth transistor T10 is connected to the first emission signal EM1, the source electrode of the tenth transistor T10 is connected to the drain electrode of the sixth transistor T6 and the high level voltage VDD, and a drain electrode of the tenth transistor T10 is connected to a second electrode of the storage capacitor Cst, a source electrode of the eleventh transistor T11 and a source electrode of the twelfth transistor T12.

The eleventh transistor T11 is switched according to the (n)th gate signal SCAN(n). A gate electrode of the eleventh transistor T11 is connected to the (n)th gate signal SCAN(n), the source electrode of the eleventh transistor T11 is connected to the drain electrode of the tenth transistor T10, the source electrode of the twelfth transistor T12 and the second electrode of the storage capacitor Cst, and a drain electrode of the eleventh transistor T11 is connected to a reference signal Vref and a drain electrode of the twelfth transistor T12.

The twelfth transistor T12 is switched according to the (n−1)th gate signal SCAN(n−1). A gate electrode of the twelfth transistor T12 is connected to the (n−1)th gate signal SCAN(n−1), the source electrode of the twelfth transistor T12 is connected to the drain electrode of the tenth transistor T10, the source electrode of the eleventh transistor T11 and the second electrode of the storage capacitor Cst, and the drain electrode of the twelfth transistor T12 is connected to the reference signal Vref and the drain electrode of the eleventh transistor T11.

The storage capacitor Cst stores the high level voltage VDD, the data signal Vdata and a threshold voltage Vth. The first electrode of the storage capacitor Cst is connected to the gate electrode of the second transistor T2, the drain electrode of the seventh transistor T7 and the source electrode of the ninth transistor T9, and the second electrode of the storage capacitor Cst is connected to the drain electrode of the tenth transistor T10, the source electrode of the eleventh transistor T11 and the source electrode of the twelfth transistor T12.

The first light emitting diode D1 is connected between the fourth and eighth transistors T4 and T8 and a low level voltage VSS and emits a light proportional to a current of the second transistor T2. The anode of the first light emitting diode D1 is connected to the drain electrode of the fourth transistor T4 and the source electrode of the eighth transistor T8, and the cathode of the first light emitting diode D1 is connected to the low level voltage VSS. The first light emitting diode D1 is disposed to correspond to the plurality of half cylindrical lenses CL. The first light emitting diode D1 has an ON state to obtain a wide view mode along a left-right direction and has an OFF state to obtain a narrow view mode along the left-right direction.

The second light emitting diode D2 is connected between the fifth transistor T5 and the low level voltage VSS and emits a light proportional to the current of the second transistor T2. The anode of the second light emitting diode D2 is connected to the drain electrode of the fifth transistor T5, and the cathode of the second light emitting diode D2 is connected to the low level voltage VSS. The second light emitting diode D2 is disposed to correspond to the plurality of half spherical lenses SL. The second light emitting diode D2 has an ON state to obtain a narrow view mode along the left-right direction.

In FIG. 10, a gate driving unit 240 of the viewing angle switchable display device according to an example embodiment of the present disclosure includes a gate signal generating part SG (gate signal generator), a first emission signal generating part EG1, a second emission signal generating part EG2 and a third emission signal generating part EG3.

The gate signal generating part SG, the first emission signal generating part EG1, the second emission signal generating part EG2 and the third emission signal generating part EG3 are connected to one horizontal pixel line of the display panel. The gate signal generating part SG and the first emission signal generating part EG1 having the same structure are disposed as previous and next stages of the gate signal generating part SG and the first emission signal generating part EG1 and are connected to the gate signal generating part SG and the first emission signal generating part EG1 in a cascade type. The plurality of stages of the gate signal generating part SG and the first emission signal generating part EG1 may be connected to the plurality of horizontal pixel lines.

For example, the gate signal generating part SG and the first emission signal generating part EG1 may correspond to one stage of a shift register.

Further, the second emission signal generating part EG2 and the third emission signal generating part EG3 having the same structure are disposed as previous and next stages of the second emission signal generating part EG2 and the third emission signal generating part EG3. The plurality of stages of the second emission signal generating part EG2 and the third emission signal generating part EG3 may be connected to the plurality of horizontal pixel lines.

The gate signal generating part SG includes first to ninth gate transistors ST1 to ST9, four gate pass transistors STp, a gate-q capacitor SCq and a gate-qb capacitor SCqb. The gate signal generating part SG generates a gate output signal SO as the nth gate signal SCAN(n) using a gate start signal SVST (or a previous gate output signal), a gate high signal SVGH, a gate low signal SVGL, a gate reset signal SQRST, and (N−1)th, (N)th and (N+2)th gate clocks SCLKN−1, SCLKN and SCLKN+2 and supplies the nth gate signal SCAN(n) to an nth horizontal pixel line of the display panel.

For example, the first to ninth gate transistors ST1 to ST9 and the four gate pass transistors STp may have a positive type. The gate start signal SVST, the gate reset signal SQRST and the (N−1)th, (N)th and (N+2)th gate clocks SCLKN−1, SCLKN and SCLKN+2 may be supplied by the timing controlling unit, and the gate high signal SVGH and the gate low signal SVGL may be supplied by a power unit.

The first emission signal generating part EG1 includes first to twelfth emission transistors ET1 to ET12, an emission-q capacitor ECq, an emission-qp capacitor ECqp and an emission-qb capacitor ECqb. The first emission signal generating part EG1 generates an emission output signal EO as the first emission signal EM1 using an emission start signal EVST (or a previous emission output signal), an emission high signal VEH, an emission low signal VEL, an emission reset signal ERST, and first and second emission clocks ECLK1 and ECLK2 and supplies the first emission signal EM1 to the nth horizontal pixel line of the display panel.

For example, the first to twelfth emission transistors ET1 to ET12 may have a positive type. The emission start signal EVST, the emission reset signal ERST and the first and second emission clocks ECLK1 and ECLK2 may be supplied by the timing controlling unit, and the emission high signal VEH and the emission low signal VEL may be supplied by the power unit.

The second emission signal generating part EG2 includes a second wide view transistor Tw2 and a first wide view transistor Tw1. The second emission signal generating part EG2 generates a low logic voltage Vl of the emission low signal VEL of the first emission signal generating part EG1 or the nth gate signal SCAN(n) of a gate output signal SO of the gate signal generating part SG as the second emission signal EM2 using a second wide view signal WV2 and a first wide view signal WV1 and supplies the second emission signal EM2 to the nth horizontal pixel line of the display panel.

For example, the first wide view transistor Tw1 and the second wide view transistor Tw2 may have a positive type. The first wide view signal WV1 and the second wide view signal WV2 may have opposite polarities and may be supplied by the timing controlling unit or the power unit.

The second wide view transistor Tw2 is switched according to the second wide view signal WV2. A gate electrode of the second wide view transistor Tw2 is connected to the second wide view signal WV2, a source electrode of the second wide view transistor Tw2 is connected to the nth gate signal SCAN(n), and a drain electrode of the second wide view transistor Tw2 is connected to a source electrode of the first wide view transistor Tw1.

The first wide view transistor Tw1 is switched according to the first wide view signal WV1. A gate electrode of the first wide view transistor Tw1 is connected to the first wide view signal WV1, the source electrode of the first wide view transistor Tw1 is connected to the drain electrode of the second wide view transistor Tw2, and a drain electrode of the first wide view transistor Tw1 is connected to a low logic voltage Vl.

The second emission signal EM2 is outputted from a connection node between the drain electrode of the second wide view transistor Tw2 and the source electrode of the first wide view transistor Tw1.

The third emission signal generating part EG3 includes a second narrow view transistor Tn2 and a first narrow view transistor Tn1. The third emission signal generating part EG3 generates the nth gate signal SCAN(n) of the gate output signal SO of the gate signal generating part SG or a low logic voltage Vl of the emission low signal VEL of the first emission signal generating part EG1 as the third emission signal EM3 using a second narrow view signal NV2 and a first narrow view signal NV1 and supplies the third emission signal EM3 to the nth horizontal pixel line of the display panel.

For example, the second narrow view transistor Tn2 and the first narrow view transistor Tn1 may have a positive type. The second narrow view signal NV2 and the first narrow view signal NV1 may have opposite polarities and may be supplied by the timing controlling unit or the power unit.

The second narrow view transistor Tn2 is switched according to the second narrow view signal NV2. A gate electrode of the second narrow view transistor Tn2 is connected to the second narrow view signal NV2, a source electrode of the second narrow view transistor Tn2 is connected to the nth gate signal SCAN(n), and a drain electrode of the second narrow view transistor Tn2 is connected to a source electrode of the first narrow view transistor Tn1.

The first narrow view transistor Tn1 is switched according to the first narrow view signal NV1. A gate electrode of the first narrow view transistor Tn1 is connected to the first narrow view signal NV1, the source electrode of the first narrow view transistor Tn1 is connected to the drain electrode of the second narrow view transistor Tn2, and a drain electrode of the first narrow view transistor Tn1 is connected to a low logic voltage Vl.

The third emission signal EM3 is outputted from a connection node between the drain electrode of the second narrow view transistor Tn2 and the source electrode of the first narrow view transistor Tn1.

In FIG. 11, during a first time period TP1 of an initial period, the (n−1)th gate signal SCAN(n−1) becomes a low logic voltage Vl, and the nth gate signal SCAN(n) and the first emission signal EM1 become a high logic voltage Vh. The ninth and twelfth transistors T9 and T12 are turned on and the first, third, sixth, seventh, eighth, tenth and eleventh transistors T1, T3, T6, T7, T8, T10 and T12 are turned off, and the first and second electrodes of the storage capacitor Cst become the initial signal Vini and the reference signal Vref, respectively, such that the first and second electrodes of the storage capacitor Cst are initialized.

During the first time period TP1 of an initial period, when the first and second light emitting diodes D1 and D2 operate as an ON state, the first wide view signal WV1 and the first narrow view signal NV1 become a low logic voltage Vl. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the fourth and fifth transistors T4 and T5 are turned on.

During the first time period TP1 of an initial period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the nth gate signal SCAN(n), and the fourth and fifth transistors T4 and T5 are turned off.

During a second time period TP2 of a sensing period, the (n−1)th gate signal SCAN(n−1) and the first emission signal EM1 become a high logic voltage Vh, and the nth gate signal SCAN(n) becomes a low logic voltage Vl. The third, sixth, ninth, tenth and twelfth transistors T3, T6, T9, T10 and T12 are turned off and the first, seventh, eighth and eleventh transistor T1, T7, T8 and T11 are turned on. The second electrode of the storage capacitor Cst becomes the reference signal Vref, and the first electrode of the storage capacitor Cst becomes a sum (Vdata+Vth) of the data signal Vdata and the threshold voltage Vth such that the threshold voltage Vth is stored in the storage capacitor Cst.

During the second time period TP2 of a sensing period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the anode of the first and second light emitting diodes D1 and D2 become the initial signal Vini.

During the second time period TP2 of a sensing period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a low logic voltage Vl due to the nth gate signal SCAN(n), and the fourth and fifth transistors T4 and T5 are turned on such that the anode of the first and second light emitting diodes D1 and D2 become the initial signal Vini.

During a third time period TP3 of a holding period, the (n−1)th gate signal SCAN(n−1), the nth gate signal SCAN(n) and the first emission signal EM1 become a high logic voltage Vh. The first, third, sixth, seventh, eighth, ninth, tenth, eleventh and twelfth transistors T1, T3, T6, T7, T8, T9, T10, T11 and T12 are turned off. The second electrode of the storage capacitor Cst is kept as the reference signal Vref, and the first electrode of the storage capacitor Cst is kept as the sum (Vdata+Vth) of the data signal Vdata and the threshold voltage Vth.

During the third time period TP3 of a holding period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the fourth and fifth transistors T4 and T5 are turned off.

During the third time period TP3 of a holding period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the nth gate signal SCAN(n), and the fourth and fifth transistors T4 and T5 are turned off.

During a fourth time period TP4 of an emission period, the (n−1)th gate signal SCAN(n−1) and the nth gate signal SCAN(n) become a high logic voltage Vh, and the first emission signal EM1 becomes a low logic voltage Vl. The first, seventh, eighth, ninth, eleventh and twelfth transistors T1, T7, T8, T9, T11 and T12 are turned off, and the third, sixth and tenth transistors T3, T6 and T9 are turned on. A current proportional to a square of a value ((Vdata+Vth+VDD−Vref−VDD)−Vth=Vdata−Vref) obtained by subtracting the threshold voltage Vth from a gate-source voltage Vgs flows through the first transistor T1, and the first and second light emitting diodes D1 and D2 emit a light having a luminance corresponding to the current flowing through the first transistor T1 according to ON and OFF states of the fourth and fifth transistors T4 and T5.

During the fourth time period TP4 of an emission period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the fourth and fifth transistors T4 and T5 are turned on.

During the fourth time period TP4 of an emission period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the nth gate signal SCAN(n), and the fourth and fifth transistors T4 and T5 are turned off.

In the viewing angle switchable display device according to an example embodiment of the present disclosure, the first and second light emitting diodes D1 and D2 emit a light according to an operation of the first to twelfth transistors T1 to T12 and the storage capacitor Cst to display an image. As a result, a variation of the threshold voltage according to a use time or deterioration of the first and second light emitting diodes D1 and D2 is compensated using the subpixel SP, and a luminance is adjusted by driving the first and second light emitting diodes D1 and D2 according to a duty ratio corresponding to an emission time.

Further, since the first and second light emitting diodes D1 and D2 are driven as an ON state and an OFF state according to the second and third emission signals EM2 and EM3, respectively, a wide view mode and a narrow view mode are obtained. A wide view mode along a left-right direction is obtained by driving the first light emitting diode D1 as an ON state and driving the second light emitting diode D2 as an ON state or an OFF state, and a narrow view mode along a left-right direction is obtained by driving the first light emitting diode D1 as an OFF state and driving the second light emitting diode D2 as an ON state.

In addition, the second emission signal generating part EG2 generating the second emission signal EM2 for switching a viewing angle is formed by the first wide view transistor Tw1 and the second wide view transistor Tw2, and the third emission signal generating part EG3 generating the third emission signal EM3 for switching a viewing angle is formed by the first narrow view transistor Tn1 and the second narrow view transistor Tn2. As a result, a size of the second and third emission signal generating parts EG2 and EG3 is minimized and a size of the gate driving unit 240 is minimized. Accordingly, an area of the non-display area is reduced to obtain a narrow bezel.

Figure 12:
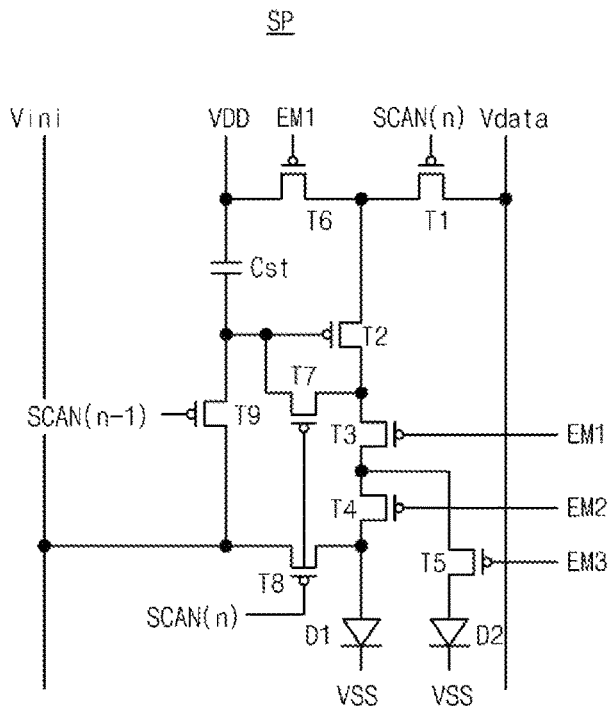
FIG. 12 is a circuit diagram showing a subpixel of a viewing angle switchable display device according to some aspects of the present disclosure.
Figure 13:
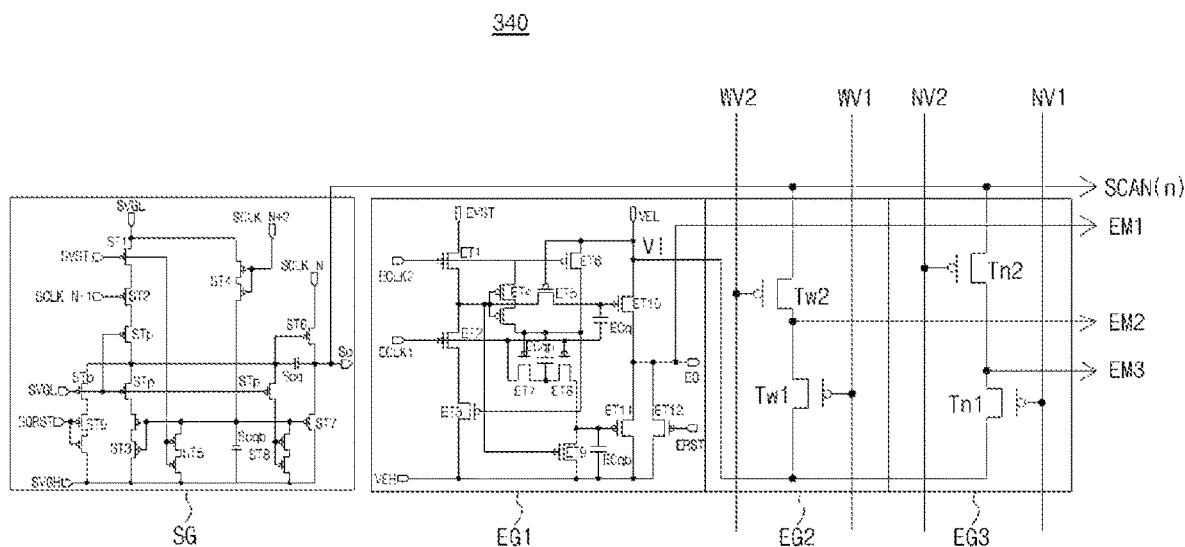
FIG. 13 is a circuit diagram showing a gate driving unit of a viewing angle switchable display device according to some aspects of the present disclosure.
Figure 14:
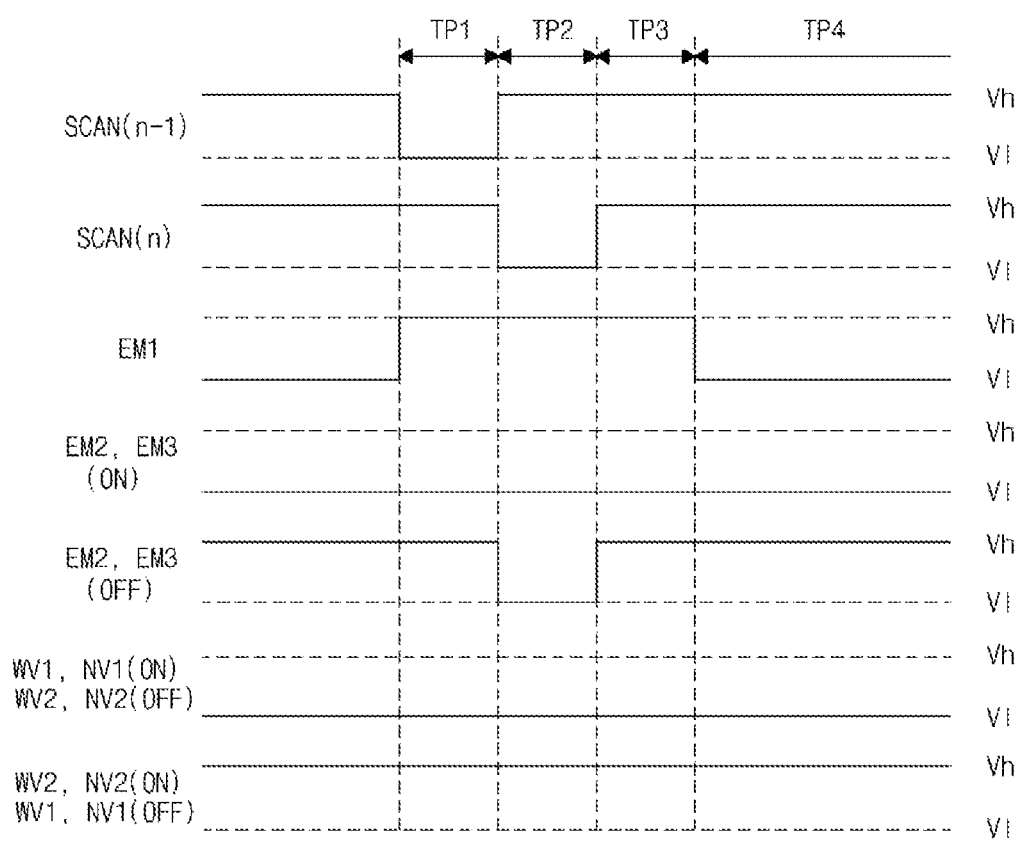
FIG. 14 is a view showing a plurality of signals used in a subpixel and a gate driving unit of a viewing angle switchable display device according to some aspects of the present disclosure.

FIG. 12 is a circuit diagram showing a subpixel of a viewing angle switchable display device according to some aspects of the present disclosure. FIG. 13 is a circuit diagram showing a gate driving unit of a viewing angle switchable display device according to some aspects of the present disclosure. FIG. 14 is a view showing a plurality of signals used in a subpixel and a gate driving unit of a viewing angle switchable display device according to some aspects of the present disclosure. Illustration on parts of example embodiments described with reference to FIGS. 12-14 that are the same as those of example embodiments described with reference to FIGS. 2-11 are omitted and will not be described for sake of brevity.

In FIG. 12, each of the red, green and blue subpixels SPr, SPg and SPb of a display panel of a viewing angle switchable display device according to an example embodiment of the present disclosure includes first to ninth transistors T1 to T9, a storage capacitor Cst and first and second light emitting diodes D1 and D2.

For example, the first to ninth transistors T1 to T9 may have a positive type.

The first transistor T1 of a switching transistor is switched (turned on and off) according to an nth gate signal SCAN(n). A gate electrode of the first transistor T1 is connected to the nth gate signal SCAN(n), a source electrode of the first transistor T1 is connected to a data signal Vdata, and a drain electrode of the first transistor T1 is connected to a source electrode of the second transistor T2 and a source electrode of the sixth transistor T6.

The second transistor T2 of a driving transistor is switched according to a voltage of a first electrode of the storage capacitor Cst. A gate electrode of the second transistor T2 is connected to the first electrode of the storage capacitor Cst, a drain electrode of the seventh transistor T7 and a source electrode of the ninth transistor T9, the source electrode of the second transistor T2 is connected to the drain electrode of the first transistor T1 and a source electrode of the sixth transistor T6, and a drain electrode of the second transistor T2 is connected to a source electrode of the third transistor T3 and a source electrode of the seventh transistor T7.

The third transistor T3 of an emission transistor is switched according to a first emission signal EM1. A gate electrode of the third transistor T3 is connected to the first emission signal EM1, the source electrode of the third transistor T3 is connected to the drain electrode of the second transistor T2 and the source electrode of the seventh transistor T7, and a drain electrode of the third transistor T3 is connected to a source electrode of the fourth transistor T4 and a source electrode of the fifth transistor T5.

The fourth transistor T4 of an emission transistor is switched according to a second emission signal EM2. A gate electrode of the fourth transistor T4 is connected to the second emission signal EM2, the source electrode of the fourth transistor T4 is connected to the drain electrode of the third transistor T3 and the source electrode of the fifth transistor T5, and a drain electrode of the fourth transistor T4 is connected to a source electrode of the eighth transistor T8 and an anode of the first light emitting diode D1.

The fifth transistor T5 of an emission transistor is switched according to a third emission signal EM3. A gate electrode of the fifth transistor T5 is connected to the third emission signal EM3, the source electrode of the fifth transistor T5 is connected to the drain electrode of the third transistor T3 and the source electrode of the fourth transistor T4, and a drain electrode of the fifth transistor T5 is connected to an anode of the second light emitting diode D2.

The sixth transistor T6 is switched according to the first emission signal EM1. A gate electrode of the sixth transistor T6 is connected to the first emission signal EM1, the source electrode of the sixth transistor T6 is connected to the drain electrode of the first transistor T1 and the source electrode of the second transistor T2, and a drain electrode of the sixth transistor T6 is connected to a high level voltage VDD and a second electrode of the storage capacitor Cst.

The seventh transistor T7 is switched according to the nth gate signal SCAN(n). A gate electrode of the seventh transistor T7 is connected to the nth gate signal SCAN(n), the source electrode of the seventh transistor T7 is connected to the drain electrode of the second transistor T2 and the source electrode of the third transistor T3, and the drain electrode of the seventh transistor T7 is connected to the gate electrode of the second transistor T2, the first electrode of the storage capacitor Cst and a source electrode of the ninth transistor T9.

The eighth transistor T8 is switched according to the nth gate signal SCAN(n). A gate electrode of the eighth transistor T8 is connected to the nth gate signal SCAN(n), a source electrode of the eighth transistor T8 is connected to the drain electrode of the fourth transistor T4 and the anode of the first light emitting diode D1, and a drain electrode of the eighth transistor T8 is connected to a drain electrode of the ninth transistor T9 and an initial signal Vini.

The ninth transistor T9 is switched according to the (n−1)th gate signal SCAN(n−1). A gate electrode of the ninth transistor T9 is connected to the (n−1)th gate signal SCAN(n−1), the source electrode of the ninth transistor T9 is connected to the first electrode of the storage capacitor Cst, the gate electrode of the second transistor T2 and the drain electrode of the seventh transistor T7, and the drain electrode of the ninth transistor T9 is connected to the drain electrode of the eighth transistor T8 and the initial signal Vini.

The storage capacitor Cst stores the high level voltage VDD, the data signal Vdata and a threshold voltage Vth. The first electrode of the storage capacitor Cst is connected to the gate electrode of the second transistor T2, the drain electrode of the seventh transistor T7 and the source electrode of the ninth transistor T9, and the second electrode of the storage capacitor Cst is connected to the high level voltage VDD and the drain electrode of the sixth transistor T6.

The first light emitting diode D1 is connected between the fourth and eighth transistors T4 and T8 and a low level voltage VSS and emits a light proportional to a current of the second transistor T2. The anode of the first light emitting diode D1 is connected to the drain electrode of the fourth transistor T4 and the source electrode of the eighth transistor T8, and the cathode of the first light emitting diode D1 is connected to the low level voltage VSS. The first light emitting diode D1 is disposed to correspond to the plurality of half cylindrical lenses CL. The first light emitting diode D1 has an ON state to obtain a wide view mode along a left-right direction and has an OFF state to obtain a narrow view mode along the left-right direction.

The second light emitting diode D2 is connected between the fifth transistor T5 and the low level voltage VSS and emits a light proportional to the current of the second transistor T2. The anode of the second light emitting diode D2 is connected to the drain electrode of the fifth transistor T5, and the cathode of the second light emitting diode D2 is connected to the low level voltage VSS. The second light emitting diode D2 is disposed to correspond to the plurality of half spherical lenses SL. The second light emitting diode D2 has an ON state to obtain a narrow view mode along the left-right direction.

In FIG. 13, a gate driving unit 340 of the viewing angle switchable display device according to an example embodiment of the present disclosure includes a gate signal generating part SG, a first emission signal generating part EG1, a second emission signal generating part EG2 and a third emission signal generating part EG3.

The gate signal generating part SG, the first emission signal generating part EG1, the second emission signal generating part EG2 and the third emission signal generating part EG3 are connected to one horizontal pixel line of the display panel. The gate signal generating part SG and the first emission signal generating part EG1 having the same structure are disposed as previous and next stages of the gate signal generating part SG and the first emission signal generating part EG1 and are connected to the gate signal generating part SG and the first emission signal generating part EG1 in a cascade type. The plurality of stages of the gate signal generating part SG and the first emission signal generating part EG1 may be connected to the plurality of horizontal pixel lines.

For example, the gate signal generating part SG and the first emission signal generating part EG1 may correspond to one stage of a shift register.

Further, the second emission signal generating part EG2 and the third emission signal generating part EG3 having the same structure are disposed as previous and next stages of the second emission signal generating part EG2 and the third emission signal generating part EG3. The plurality of stages of the second emission signal generating part EG2 and the third emission signal generating part EG3 may be connected to the plurality of horizontal pixel lines.

The gate signal generating part SG includes first to ninth gate transistors ST1 to ST9, four gate pass transistors STp, a gate-q capacitor SCq and a gate-qb capacitor SCqb. The gate signal generating part SG generates a gate output signal SO as the nth gate signal SCAN(n) using a gate start signal SVST (or a previous gate output signal), a gate high signal SVGH, a gate low signal SVGL, a gate reset signal SQRST, and (N−1)th, (N)th and (N+2)th gate clocks SCLKN−1, SCLKN and SCLKN+2 and supplies the nth gate signal SCAN(n) to an nth horizontal pixel line of the display panel.

For example, the first to ninth gate transistors ST1 to ST9 and the four gate pass transistors STp may have a positive type. The gate start signal SVST, the gate reset signal SQRST and the (N−1)th, (N)th and (N+2)th gate clocks SCLKN−1, SCLKN and SCLKN+2 may be supplied by the timing controlling unit, and the gate high signal SVGH and the gate low signal SVGL may be supplied by a power unit.

The first emission signal generating part EG1 includes first to twelfth emission transistors ET1 to ET12, an emission-q capacitor ECq, an emission-qp capacitor ECqp and an emission-qb capacitor ECqb. The first emission signal generating part EG1 generates an emission output signal EO as the first emission signal EM1 using an emission start signal EVST (or a previous emission output signal), an emission high signal VEH, an emission low signal VEL, an emission reset signal ERST, and first and second emission clocks ECLK1 and ECLK2 and supplies the first emission signal EM1 to the nth horizontal pixel line of the display panel.

For example, the first to twelfth emission transistors ET1 to ET12 may have a positive type. The emission start signal EVST, the emission reset signal ERST and the first and second emission clocks ECLK1 and ECLK2 may be supplied by the timing controlling unit, and the emission high signal VEH and the emission low signal VEL may be supplied by the power unit.

The second emission signal generating part EG2 includes a second wide view transistor Tw2 and a first wide view transistor Tw1. The second emission signal generating part EG2 generates a low logic voltage Vl of the emission low signal VEL of the first emission signal generating part EG1 or the nth gate signal SCAN(n) of a gate output signal SO of the gate signal generating part SG as the second emission signal EM2 using a second wide view signal WV2 and a first wide view signal WV1 and supplies the second emission signal EM2 to the nth horizontal pixel line of the display panel.

For example, the first wide view transistor Tw1 and the second wide view transistor Tw2 may have a positive type. The first wide view signal WV1 and the second wide view signal WV2 may have opposite polarities and may be supplied by the timing controlling unit or the power unit.

The second wide view transistor Tw2 is switched according to the second wide view signal WV2. A gate electrode of the second wide view transistor Tw2 is connected to the second wide view signal WV2, a source electrode of the second wide view transistor Tw2 is connected to the nth gate signal SCAN(n), and a drain electrode of the second wide view transistor Tw2 is connected to a source electrode of the first wide view transistor Tw1.

The first wide view transistor Tw1 is switched according to the first wide view signal WV1. A gate electrode of the first wide view transistor Tw1 is connected to the first wide view signal WV1, the source electrode of the first wide view transistor Tw1 is connected to the drain electrode of the second wide view transistor Tw2, and a drain electrode of the first wide view transistor Tw1 is connected to a low logic voltage Vl.

The second emission signal EM2 is outputted from a connection node between the drain electrode of the second wide view transistor Tw2 and the source electrode of the first wide view transistor Tw1.

The third emission signal generating part EG3 includes a second narrow view transistor Tn2 and a first narrow view transistor Tn1. The third emission signal generating part EG3 generates the nth gate signal SCAN(n) of the gate output signal SO of the gate signal generating part SG or a low logic voltage Vl of the emission low signal VEL of the first emission signal generating part EG1 as the third emission signal EM3 using a second narrow view signal NV2 and a first narrow view signal NV1 and supplies the third emission signal EM3 to the nth horizontal pixel line of the display panel.

For example, the second narrow view transistor Tn2 and the first narrow view transistor Tn1 may have a positive type. The second narrow view signal NV2 and the first narrow view signal NV1 may have opposite polarities and may be supplied by the timing controlling unit or the power unit.

The second narrow view transistor Tn2 is switched according to the second narrow view signal NV2. A gate electrode of the second narrow view transistor Tn2 is connected to the second narrow view signal NV2, a source electrode of the second narrow view transistor Tn2 is connected to the nth gate signal SCAN(n), and a drain electrode of the second narrow view transistor Tn2 is connected to a source electrode of the first narrow view transistor Tn1.

The first narrow view transistor Tn1 is switched according to the first narrow view signal NV1. A gate electrode of the first narrow view transistor Tn1 is connected to the first narrow view signal NV1, the source electrode of the first narrow view transistor Tn1 is connected to the drain electrode of the second narrow view transistor Tn2, and a drain electrode of the first narrow view transistor Tn1 is connected to a low logic voltage Vl.

The third emission signal EM3 is outputted from a connection node between the drain electrode of the second narrow view transistor Tn2 and the source electrode of the first narrow view transistor Tn1.

In FIG. 14, during a first time period TP1 of an initial period, the (n−1)th gate signal SCAN(n−1) becomes a low logic voltage Vl, and the nth gate signal SCAN(n) and the first emission signal EM1 become a high logic voltage Vh. The ninth transistor T9 is turned on and the first, third, sixth, seventh and eighth transistors T1, T3, T6, T7 and T8 are turned off, and the first and second electrodes of the storage capacitor Cst become the initial signal Vini and the high level voltage VDD, respectively, such that the first electrode of the storage capacitor Cst is initialized.

During the first time period TP1 of an initial period, when the first and second light emitting diodes D1 and D2 operate as an ON state, the first wide view signal WV1 and the first narrow view signal NV1 become a low logic voltage Vl. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the fourth and fifth transistors T4 and T5 are turned on.

During the first time period TP1 of an initial period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the nth gate signal SCAN(n), and the fourth and fifth transistors T4 and T5 are turned off.

During a second time period TP2 of a sensing period, the (n−1)th gate signal SCAN(n−1) and the first emission signal EM1 become a high logic voltage Vh, and the nth gate signal SCAN(n) becomes a low logic voltage Vl. The third, sixth and ninth transistors T3, T6 and T9 are turned off and the first, seventh and eighth transistor T1, T7 and T8 are turned on. The second electrode of the storage capacitor Cst becomes the high level voltage VDD, and the first electrode of the storage capacitor Cst becomes a sum (Vdata+Vth) of the data signal Vdata and the threshold voltage Vth such that the threshold voltage Vth is stored in the storage capacitor Cst.

During the second time period TP2 of a sensing period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the anode of the first and second light emitting diodes D1 and D2 become the initial signal Vini.

During the second time period TP2 of a sensing period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a low logic voltage Vl due to the nth gate signal SCAN(n), and the fourth and fifth transistors T4 and T5 are turned on such that the anode of the first and second light emitting diodes D1 and D2 become the initial signal Vini.

During a third time period TP3 of a holding period, the (n−1)th gate signal SCAN(n−1), the nth gate signal SCAN(n) and the first emission signal EM1 become a high logic voltage Vh. The first, third, sixth, seventh, eighth and ninth transistors T1, T3, T6, T7, T8 and T9 are turned off. The second electrode of the storage capacitor Cst is kept as the high level voltage VDD, and the first electrode of the storage capacitor Cst is kept as the sum (Vdata+Vth) of the data signal Vdata and the threshold voltage Vth.

During the third time period TP3 of a holding period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the fourth and fifth transistors T4 and T5 are turned off.

During the third time period TP3 of a holding period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the nth gate signal SCAN(n), and the fourth and fifth transistors T4 and T5 are turned off.

During a fourth time period TP4 of an emission period, the (n−1)th gate signal SCAN(n−1) and the nth gate signal SCAN(n) become a high logic voltage Vh, and the first emission signal EM1 becomes a low logic voltage Vl. The first, seventh, eighth and ninth transistors T1, T7, T8 and T9 are turned off, and the third and sixth transistors T3 and T6 are turned on. A current proportional to a square of a value ((Vdata+Vth)−Vth=Vdata) obtained by subtracting the threshold voltage Vth from a gate-source voltage Vgs flows through the first transistor T1, and the first and second light emitting diodes D1 and D2 emit a light having a luminance corresponding to the current flowing through the first transistor T1 according to ON and OFF states of the fourth and fifth transistors T4 and T5.

During the fourth time period TP4 of an emission period, when the first and second light emitting diodes D1 and D2 operate as an ON state, the first wide view signal WV1 and the first narrow view signal NV1 become a low logic voltage Vl, and the second wide view signal WV2 and the second narrow view signal NV2 become a high logic voltage Vh. The first wide view transistor Tw1 and the first narrow view transistor Tn1 are turned on, and the second wide view transistor Tw2 and the second narrow view transistor Tn2 are turned off. The second and third emission signals EM2 and EM3 outputted from the second and third emission signal generating parts EG2 and EG3 become a low logic voltage Vl due to the emission low signal VEL, and the fourth and fifth transistors T4 and T5 are turned on.

During the fourth time period TP4 of an emission period, when the first and second light emitting diodes D1 and D2 operate as an OFF state, the first wide view signal WV1 and the first narrow view signal NV1 become a high logic voltage Vh, and the second wide view signal WV2 and the second narrow view signal NV2 become a low logic voltage Vl. The first wide view transistor Tw1 and the first narrow view transistor Tn1 are turned off, and the second wide view transistor Tw2 and the second narrow view transistor Tn2 are turned on. The second and third emission signals EM2 and EM3 outputted from the second and third emission signal generating parts EG2 and EG3 become a high logic voltage Vh due to the nth gate signal SCAN(n), and the fourth and fifth transistors T4 and T5 are turned off.

In the viewing angle switchable display device according to an example embodiment of the present disclosure, the first and second light emitting diodes D1 and D2 emit a light according to an operation of the first to ninth transistors T1 to T9 and the storage capacitor Cst to display an image. As a result, a variation of the threshold voltage according to a use time or deterioration of the first and second light emitting diodes D1 and D2 is compensated using the subpixel SP, and a luminance is adjusted by driving the first and second light emitting diodes D1 and D2 according to a duty ratio corresponding to an emission time.

Further, since the first and second light emitting diodes D1 and D2 are driven as an ON state and an OFF state according to the second and third emission signals EM2 and EM3, respectively, a wide view mode and a narrow view mode are obtained. A wide view mode along a left-right direction is obtained by driving the first light emitting diode D1 as an ON state and driving the second light emitting diode D2 as an ON state or an OFF state, and a narrow view mode along a left-right direction is obtained by driving the first light emitting diode D1 as an OFF state and driving the second light emitting diode D2 as an ON state.

In addition, the second emission signal generating part EG2 generating the second emission signal EM2 for switching a viewing angle is formed by the first wide view transistor Tw1 and the second wide view transistor Tw2, and the third emission signal generating part EG3 generating the third emission signal EM3 for switching a viewing angle is formed by the first narrow view transistor Tn1 and the second narrow view transistor Tn2. As a result, a size of the second and third emission signal generating parts EG2 and EG3 is minimized and a size of the gate driving unit 340 is minimized. Accordingly, an area of the non-display area is reduced to obtain a narrow bezel.

Consequently, in the viewing angle switchable display device according to the present disclosure, since the viewing angle switching emission signal is generated by switching the input and output signals of the gate signal generating part and the emission signal generating part with two transistors, an area of the non-display area is reduced and a narrow bezel is obtained.

Further, since the viewing angle switching emission signal is generated using the first and second wide view signals and the first and second narrow view signals, a size of the gate driving unit is minimized and a narrow bezel is obtained.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device with a switchable viewing angle, comprising:
    a timing controller configured to generate an image data, a data control signal, and a gate control signal;
    a data driver configured to generate a data signal using the image data and the data control signal;
    a gate driver configured to generate a gate signal and first to third emission signals using the gate control signal; and
    a display panel including a plurality of subpixels, the display panel configured to display an image using the data signal, the gate signal, and the first to third emission signals,
    wherein the gate driver includes:
    a gate signal generator configured to generate the gate signal;
    a first emission signal generator configured to generate the first emission signal; and
    second and third emission signal generators configured to generate the second and third emission signals, respectively, using input and output signals of the gate signal generator and input and output signals of the first emission signal generator.

2. The display device of claim 1, wherein the display panel includes:
    an array layer including a plurality of transistors, a storage capacitor and first and second light emitting diodes in each of the plurality of subpixels;
    a touch layer over the array layer;
    a lens layer over the touch layer and including a plurality of half cylindrical lenses corresponding to the first light emitting diode and a plurality of half spherical lenses corresponding to the second light emitting diode; and
    a polarizing layer over the lens layer and including a linear polarizing layer and a retardation layer.

3. The display device of claim 2, wherein the plurality of subpixels include red, green and blue subpixels forming one pixel, and
    wherein a first number of the plurality of half spherical lenses in the green subpixel is greater than a second number of the plurality of half spherical lenses in the red subpixel and the first number of the plurality of half spherical lenses is smaller than a third number of the plurality of half spherical lenses in the blue subpixel.

4. The display device of claim 2, wherein the plurality of subpixels include red, green and blue subpixels constituting one pixel, and
    wherein a first anode of the first light emitting diode and a second anode of the second light emitting diode in the red subpixel of adjacent pixels are disposed between a first anode of the first light emitting diode and a second anode of the second light emitting diode in the blue subpixel.

5. The display device of claim 1, wherein the gate signal includes a gate1 signal and a gate2 signal,
    wherein the gate signal generator includes a first component for generating the gate1 signal and a second component for generating the gate2 signal, wherein the second emission signal generator includes:
    a first wide view transistor switched according to a first wide view signal and generating the first emission signal as the second emission signal, and
    a second wide view transistor switched according to a second wide view signal having an opposite polarity to the first wide view signal and generating a high logic voltage of the input signal of the first emission signal generating part as the second emission signal, and
    wherein the third emission signal generator includes:
    a first narrow view transistor switched according to a first narrow view signal and generating the first emission signal as the third emission signal, and
    a second narrow view transistor switched according to a second narrow view signal having an opposite polarity to the first narrow view signal and generating a high logic voltage of the input signal of the first emission signal generating part as the third emission signal.

6. The display device of claim 5, wherein each of the plurality of subpixels includes:
    a first transistor connected to a high level voltage;
    a second transistor switched according to the second emission signal and connected to the first transistor;
    a third transistor switched according to the gate2 signal and connected to the first transistor;
    a fourth transistor switched according to the gate2 signal and connected to the first transistor;
    a fifth transistor switched according to the gate2 signal and connected to the second transistor;
    a sixth transistor switched according to the gate2 signal and connected to the third transistor;
    a seventh transistor switched according to the first emission signal and connected to a reference signal; and
    an eighth transistor switched according to the gate1 signal and connected to the data signal;
    a storage capacitor connected between the first, fourth and eighth transistors;
    a first light emitting diode connected between the second transistor and a low level voltage; and
    a second light emitting diode connected between the third transistor and the low level voltage.

7. The display device of claim 6, wherein during a first time period,
    the gate1 signal and the first emission signal have a low logic voltage and the gate2 signal has a high logic voltage, the second and third emission signals have a low logic voltage for the first and second light emitting diodes of an ON state, and the second and third emission signals have a high logic voltage for the first and second light emitting diodes of an OFF state, wherein during a second time period,
the gate1 signal and the gate2 signal have a low logic voltage and the first emission signal has a high logic voltage, the second and third emission signals have a high logic voltage for the first and second light emitting diodes of an ON state, and the second and third emission signals have a high logic voltage for the first and second light emitting diodes of an OFF state, wherein during a third time period,
the gate1 signal, the gate2 signal and the first emission signal have a high logic voltage, the second and third emission signals have a high logic voltage for the first and second light emitting diodes of an ON state, and the second and third emission signals have a high logic voltage for the first and second light emitting diodes of an OFF state, and wherein during a fourth time period,
the gate1 signal and the gate2 signal have a high logic voltage and the first emission signal has a low logic voltage, the second and third emission signals has a low logic voltage for the first and second light emitting diodes of an ON state, and the second and third emission signals have a high logic voltage for the first and second light emitting diodes of an OFF state.

8. The display device of claim 1, wherein the second emission signal generator includes,
a first wide view transistor switched according to a first wide view signal and generating the first gate signal as the second emission signal, and
a second wide view transistor switched according to a second wide view signal having an opposite polarity to the first wide view signal and generating a low logic voltage of the input signal of the first emission signal generating part as the second emission signal, and
wherein the third emission signal generating part includes,
a first narrow view transistor switched according to a first narrow view signal and generating the gate signal as the third emission signal, and
a second narrow view transistor switched according to according to a second narrow view signal having an opposite polarity to the first narrow view signal and generating a low logic voltage of the input signal of the first emission signal generating part as the third emission signal.

9. The display device of claim 8, wherein the gate signal includes an (n−1)th gate signal and an nth gate signal, and
wherein each of the plurality of subpixels includes:
a first transistor switched according to the nth gate signal and connected to the data signal;
a second transistor connected to the first transistor;
a third transistor switched according to the first emission signal and connected to the second transistor;
a fourth transistor switched according to the second emission signal and connected to the third transistor;
a fifth transistor switched according to the third emission signal and connected to the third transistor;
a sixth transistor switched according to the first emission signal and connected to the first transistor;
a seventh transistor switched according to the nth gate signal and connected to the second transistor;
an eighth transistor switched according to the nth gate signal and connected to the fourth transistor;
a ninth transistor switched according to the (n−1)th gate signal and connected to the second transistor;
a tenth transistor switched according to the first emission signal and connected to a high level voltage;
an eleventh transistor switched according to the nth gate signal and connected to a reference voltage;
a twelfth transistor switched according to the (n−1)th gate signal and connected to the reference voltage;
a storage capacitor connected between the second, seventh, ninth and tenth transistors;
a first light emitting diode connected between the fourth transistor and a low level voltage; and
a second light emitting diode connected between the fifth transistor and the low level voltage.

10. The display device of claim 9, wherein during a first time period, the (n−1)th gate signal has a low logic voltage and the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state, wherein during a second time period, the (n−1)th gate signal and the first emission signal have a high logic voltage and the nth gate signal has a low logic voltage, the second and third emission signals have a low logic voltage for the first and second light emitting diodes of an ON state, and the second and third emission signals have a low logic voltage for the first and second light emitting diodes of an OFF state, wherein during a third time period, the (n−1)th gate signal, the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state, and wherein during a fourth time period, the (n−1)th gate signal and the nth gate signal have a high logic voltage and the first emission signal has a low logic voltage, the second and third emission signals has a low logic voltage for the first and second light emitting diodes of an ON state, and the second and third emission signals have a high logic voltage for the first and second light emitting diodes of an OFF state.

11. The display device of claim 8, wherein the gate signal includes an (n−1)th gate signal and an nth gate signal, and
wherein each of the plurality of subpixels includes:
a first transistor switched according to the nth gate signal and connected to the data signal;
a second transistor connected to the first transistor;
a third transistor switched according to the first emission signal and connected to the second transistor;
a fourth transistor switched according to the second emission signal and connected to the third transistor;
a fifth transistor switched according to the third emission signal and connected to the third transistor;
a sixth transistor switched according to the first emission signal and connected to the first transistor;
a seventh transistor switched according to the nth gate signal and connected to the second transistor;
an eighth transistor switched according to the nth gate signal and connected to the fourth transistor;
a ninth transistor switched according to the (n−1)th gate signal and connected to the second transistor;
a storage capacitor connected between the second, sixth, seventh and ninth transistors;
a first light emitting diode connected between the fourth transistor and a low level voltage; and a second light emitting diode connected between the fifth transistor and the low level voltage.

12. The display device of claim 11, wherein during a first time period, the (n−1)th gate signal has a low logic voltage and the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state, wherein during a second time period, the (n−1)th gate signal and the first emission signal have a high logic voltage and the nth gate signal has a low logic voltage, the second and third emission signals have a low logic voltage for the first and second light emitting diodes of an ON state, and the second and third emission signals have a low logic voltage for the first and second light emitting diodes of an OFF state, wherein during a third time period, the (n−1)th gate signal, the nth gate signal and the first emission signal have a high logic voltage, the second and third emission signals have a low logic voltage for the first and second light emitting diodes of an ON state, and the second and third emission signals have a high logic voltage for the first and second light emitting diodes of an OFF state, and wherein during a fourth time period, the (n−1)th gate signal and the nth gate signal have a high logic voltage and the first emission signal has a low logic voltage, the second and third emission signals has a low logic voltage for the first and second light emitting diodes of an ON state, and the second and third emission signals have a high logic voltage for the first and second light emitting diodes of an OFF state.

13. A display device, comprising:
a display panel including a subpixel having first and second light emitting diodes operating in one of an ON state and an OFF state using a data signal, a gate signal, first to third emission signals, a half cylindrical lens, and a half spherical lens corresponding to the first and second light emitting diodes, respectively;
a data driver configured to generate the data signal; and
a gate driver including a gate signal generator configured to generate the gate signal, a first emission signal generator configured to generate the first emission signal, and second and third emission signal generators configured to generate the second and third emission signals, respectively, using input and output signals of the gate signal generator and input and output signals of the first emission signal generator.

14. The display device of claim 13, wherein the gate signal includes a gate1 signal and a gate2 signal,
wherein the gate signal generator is configured to generate the includes a first component configured to generate the gate1 signal and a second component configured to generate the gate2 signal,
wherein the second emission signal generator is configured to generate one of the first emission signal of the output signal of the first emission signal generator and a high logic voltage of the input signal of the first emission signal generator as the second emission signal, and
wherein the third emission signal generator is configured to generate one of the first emission signal of the output signal of the first emission signal generator and a high logic voltage of the input signal of the first emission signal generator as the third emission signal.

15. The display device of claim 13, wherein the second emission signal generator is configured to generate one of the gate signal of the output signal of the gate signal generator and a low logic voltage of the input signal of the first emission signal generator as the second emission signal, and
wherein the third emission signal generator is configured to generate one of the gate signal of the output signal of the gate signal generator and a low logic voltage of the input signal of the first emission signal generator as the third emission signal.

16. A display device with a switchable viewing angle, comprising:
a controller configured to generate an image data, a data control signal, and a gate control signal;
a data driver configured to generate a data signal using the image data and the data control signal;
a gate driver configured to generate a gate signal and first to third emission signals using the gate control signal and at least two transistors; and
a display panel configured to display an image using the data signal, the gate signal, and the first to third emission signals;
wherein the gate driver is configured to cause switching of a viewing angle of the image between a wide viewing angle and a narrow viewing angle using the first to third emission signals.

17. The display device of claim 16, wherein the gate driver comprises:
a gate signal generator configured to generate the gate signal;
a first emission signal generator configured to generate the first emission signal;
a second emission signal generator configured to generate the second emission signal; and
a third emission signal generator configured to generate the third emission signal, wherein the second emission signal and the third emission signal are generated using input and output signals of the gate signal generator and input and output signals of the first emission signal generator.

18. The display device of claim 1, wherein the display panel comprises:
a plurality of subpixels;
an array layer including a plurality of transistors, a storage capacitor and first and second light emitting diodes in each of the plurality of subpixels;
a touch layer over the array layer;
a lens layer over the touch layer and including a plurality of half cylindrical lenses corresponding to the first light emitting diode and a plurality of half spherical lenses corresponding to the second light emitting diode; and
a polarizing layer over the lens layer and including a linear polarizing layer and a retardation layer.

19. The display device of claim 18, wherein each of the plurality of subpixels is formed of a red subpixel, a green, and a blue subpixel, and
wherein a first number of the plurality of half spherical lenses in the green subpixel is greater than a second number of the plurality of half spherical lenses in the red subpixel and the first number of the plurality of half spherical lenses is smaller than a third number of the plurality of half spherical lenses in the blue subpixel.

20. The display device of claim 18, wherein each of the plurality of subpixels is formed of a red subpixel, a green, and a blue subpixel, and wherein a first anode of the first light emitting diode and a second anode of the second light emitting diode in the red subpixel of adjacent pixels are disposed between a first anode of the first light emitting diode and a second anode of the second light emitting diode in the blue subpixel.

* * * * *